(12) United States Patent
Sun et al.

(10) Patent No.: US 11,716,914 B2
(45) Date of Patent: Aug. 1, 2023

(54) NON-VOLATILE MEMORY DEVICE WITH FILAMENT CONFINEMENT

(71) Applicant: GLOBALFOUNDRIES Singapore Pte. Ltd., Singapore (SG)

(72) Inventors: Jianxun Sun, Singapore (SG); Juan Boon Tan, Singapore (SG); Tupei Chen, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 155 days.

(21) Appl. No.: 17/094,819

(22) Filed: Nov. 11, 2020

(65) Prior Publication Data

US 2022/0149277 A1  May 12, 2022

(51) Int. Cl.
*H10N 70/00* (2023.01)
*H10B 63/00* (2023.01)

(52) U.S. Cl.
CPC ........... *H10N 70/841* (2023.02); *H10B 63/00* (2023.02); *H10N 70/021* (2023.02); *H10N 70/063* (2023.02)

(58) Field of Classification Search
CPC .................... H01L 45/1608; H01L 45/168
See application file for complete search history.

(56) References Cited

U.S. PATENT DOCUMENTS

| | | | |
|---|---|---|---|
| 10,115,897 B1* | 10/2018 | Sato | ..................... H01L 45/1226 |
| 10,490,745 B2 | 11/2019 | Sun et al. | |
| 2019/0096481 A1* | 3/2019 | Tanaka | ..................... H01L 45/16 |
| 2020/0411592 A1* | 12/2020 | El Hajjam | ............. H01L 27/249 |
| 2021/0313512 A1* | 10/2021 | Cai | ....................... H10N 70/023 |

OTHER PUBLICATIONS

D.K. Lee et al., Fabrication of nano-wedge resistive switching memory and analysis on its switching characteristics, 2017 Silicon Nanoelectronics Workshop (SNW), 2017, pp. 55-56.
Z. Zhang et al., Nanometer-Scale HfOx RRAM, IEEE Electron Device Letters, 2013, pp. 1005-1007, vol. 34, No. 8, IEEE.
Muxi Yu et al., Novel vertical 3D structure of TaOx-based RRAM with self-localized switching region by sidewall electrode oxidation, Scientific Reports, 2016, vol. 6, pp. 1-10.

* cited by examiner

*Primary Examiner* — Mounir S Amer
(74) *Attorney, Agent, or Firm* — David Cain

(57) ABSTRACT

A memory device and method of making the same is provided. The memory device comprises a first electrode having a length along a first axis, a second electrode having a length along a second axis that is perpendicular to the first axis, and a switching layer adjacent to the first electrode. A portion of the switching layer is positioned between a first electrode edge and a second electrode portion. The cross-sections of the first and second electrodes may have a polygonal shape.

19 Claims, 26 Drawing Sheets

A - A'

NON-VOLATILE MEMORY DEVICE WITH FILAMENT CONFINEMENT

FIELD OF THE INVENTION

The present invention relates generally to integrated circuits and fabrication of integrated circuits, and more particularly to structures for a non-volatile memory device and methods of making non-volatile memory devices.

BACKGROUND

Semiconductor memory devices may generally be categorized into volatile memory devices and non-volatile memory devices. Volatile memory devices typically require a continuous supply of power to maintain stored information, whereas non-volatile memory devices are able to retain data even when powered off. Examples of volatile memory devices include static random-access memory (SRAM) and dynamic random-access memory (DRAM). Examples of non-volatile memory devices include flash memory, read-only memory (ROM), non-volatile random-access memory such as resistive random-access memory (ReRAM or RRAM).

A resistive random-access memory can store information via a resistive element between two conductive electrodes, the resistive element having a resistance value that can vary between a high resistance state and a low resistance state, corresponding to different logical values for data storage. For example, to write a logical "1" value, a switching voltage may be applied so as to form one or more filaments within the resistive element, creating a conductive path across the resistive element to provide a low resistance state. Conversely, a switching voltage may be applied to destroy the filaments, thereby removing the conductive path to provide a high resistance state.

However, due to variations in the filament formation and destruction process, the resistance values for the high and low resistance states can vary significantly. Consequently, switching voltages required to program the memory device so as to change the information storing states may also vary due to at least in part to the resistance variations as aforementioned.

Improved structures for non-volatile memory devices and methods for making such non-volatile memory devices are needed.

SUMMARY

According to an embodiment of the invention, a memory device comprises a first electrode having a length along a first axis, a second electrode having a length along a second axis that is perpendicular to the first axis, and a switching layer adjacent to the first electrode. A portion of the switching layer is positioned between a first electrode edge and a second electrode portion.

According to another embodiment of the invention, a memory device comprises a first vertical electrode having a length along a vertical axis, a first horizontal electrode having a length along a horizontal axis, a second horizontal electrode having a length along a horizontal axis and parallel to the first horizontal electrode, and a switching layer adjacent to the first vertical electrode. A first portion of the switching layer is positioned between the first vertical electrode and the first horizontal electrode, and a second portion of the switching layer is positioned between the first vertical electrode and the second horizontal electrode. The first and second portions of the switching layer is positioned adjacent to an edge portion on the vertical electrode.

According to yet another embodiment of the invention, a method of fabricating a memory device is provided. The method comprises providing a first electrode having a first axis, providing a second electrode having a second axis perpendicular to the first axis, and providing a switching layer adjacent to the first electrode. A portion of the switching layer is positioned between a first electrode edge and a second electrode portion.

BRIEF DESCRIPTION OF THE DRAWINGS

The accompanying drawings illustrate examples of various non-limiting embodiments of the invention and constitute a part of the specification. The drawings, along with the above general description of the invention, and the following detailed description of the various embodiments, serve to explain the examples of the non-limiting embodiments of the invention. In the drawings, like reference numerals generally refer to like features in the various views.

Figure 1:
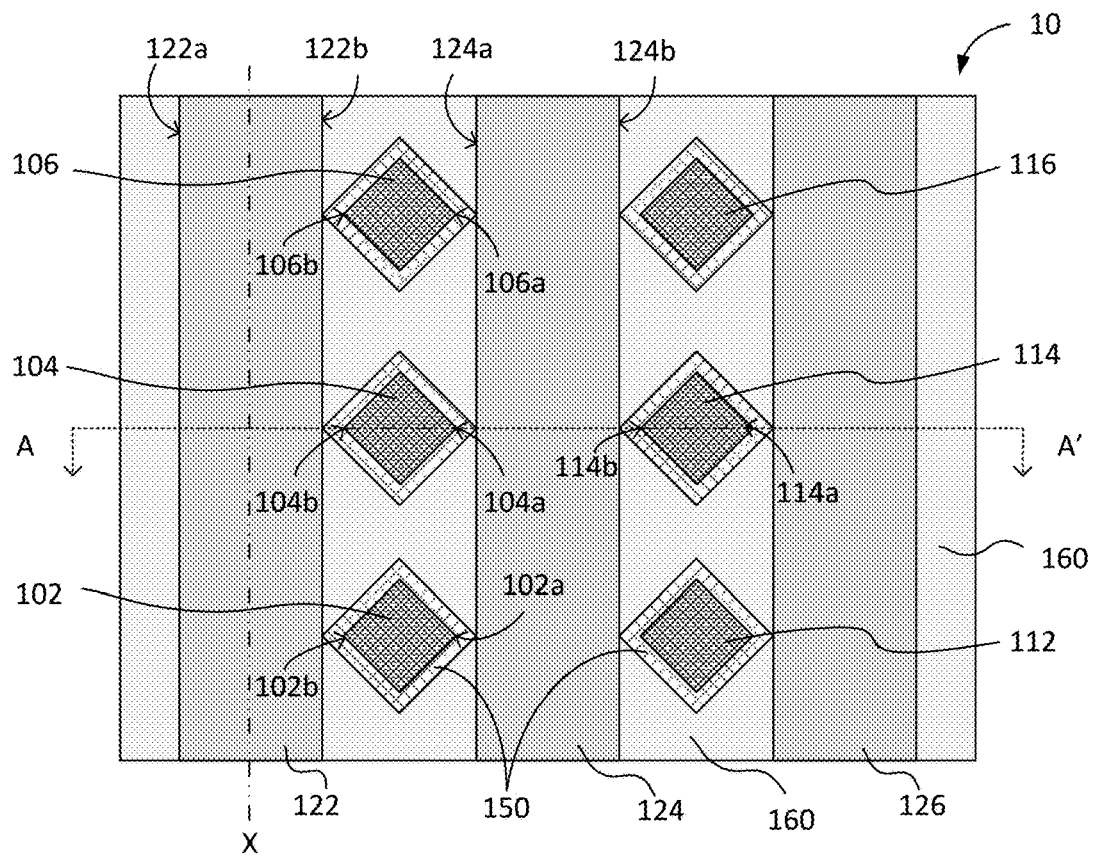
FIG. 1 shows a simplified top-down view of a memory device according to an exemplary embodiment of the invention.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale and the dimensions of some of the elements in the drawings may be exaggerated relative to other elements to help improve understanding of the embodiments of the device.

DETAILED DESCRIPTION

In accordance with an exemplary embodiment of the invention, a memory device 10 is disposed in a metallization level of an interconnect structure fabricated by middle-of-line and back-end-of-line processing over a substrate 100. In some embodiments, memory device 10 may be a resistive memory cell type, such as random-access memory (ReRAM or RRAM) or conductive-bridging random-access memory (CBRAM) as examples. The memory device 10 may be connected to one of the conductive lines within the interconnect structure, such as the M2 metallization level. The memory device 10 includes a first electrode having a length along a first axis, and a second electrode having a length along a second axis that is perpendicular to the first axis. For example, the first axis may be a Y-axis and the second axis may be an X-axis. The first electrode may be part of a first array of electrodes comprising one or more rows of at least two electrodes arranged spaced apart and parallel to the first axis. The second electrode may be part of a second array of electrodes comprising one or more rows of at least two electrodes arranged spaced apart and parallel to the second axis. Referring to FIG. 1 which shows an exemplary top view of memory device 10 in an embodiment of the invention, a first array of electrodes is parallel to the Y-axis and includes a first vertical row of electrodes comprising vertical electrodes 102, 104 and 106, and a second vertical row of electrodes comprising vertical electrodes 112, 114 and 116. Each of the vertical electrodes 102, 104, 106, 112, 114 and 116 has a length along the Y-axis and each have side surfaces and edges along the Y-axis. A vertical electrode may have a polygonal cross-section when viewed along the Y-axis, such as a square or a diamond as an example. The second array of electrodes is parallel to a X-axis (indicated by the dotted line marked "X" in FIG. 1) and includes a first horizontal row of electrodes comprising horizontal electrodes 122, 124 and 126, and a second horizontal row of electrodes positioned below the first horizontal row, comprising horizontal electrodes 132, 134 and 136 (not shown in FIG. 1). The horizontal electrodes 122, 124, 126, 132, 134 and 136 each have a length along the X-axis and each have side surfaces and edges along the X-axis. The first and second array of electrodes may interleave each other such that the first vertical row of electrodes are positioned between horizontal electrodes 122 and 124. The second vertical row of electrodes are similarly positioned between horizontal electrodes 124 and 126. The first and second array of electrodes may comprise an electrically conductive material, for example, a metal or an alloy thereof. The material choice for a vertical electrode may be selected based on factors such as oxidation resistance and work function difference relative to the horizontal electrode. Non-limiting examples of suitable conductive material for the electrodes include copper, cobalt, hafnium, platinum, ruthenium, silver, tantalum, tantalum nitride, titanium, titanium nitride, tungsten, or alloys thereof. The first and second array of electrodes may be disposed in a metallization level of an interconnect structure fabricated by middle-of-line (MOL) or back-end-of-line (BEOL) processes over a substrate 100 (not shown), and may be arranged in an interlayer dielectric material 160 comprising one or more layers.

Figure 2A:
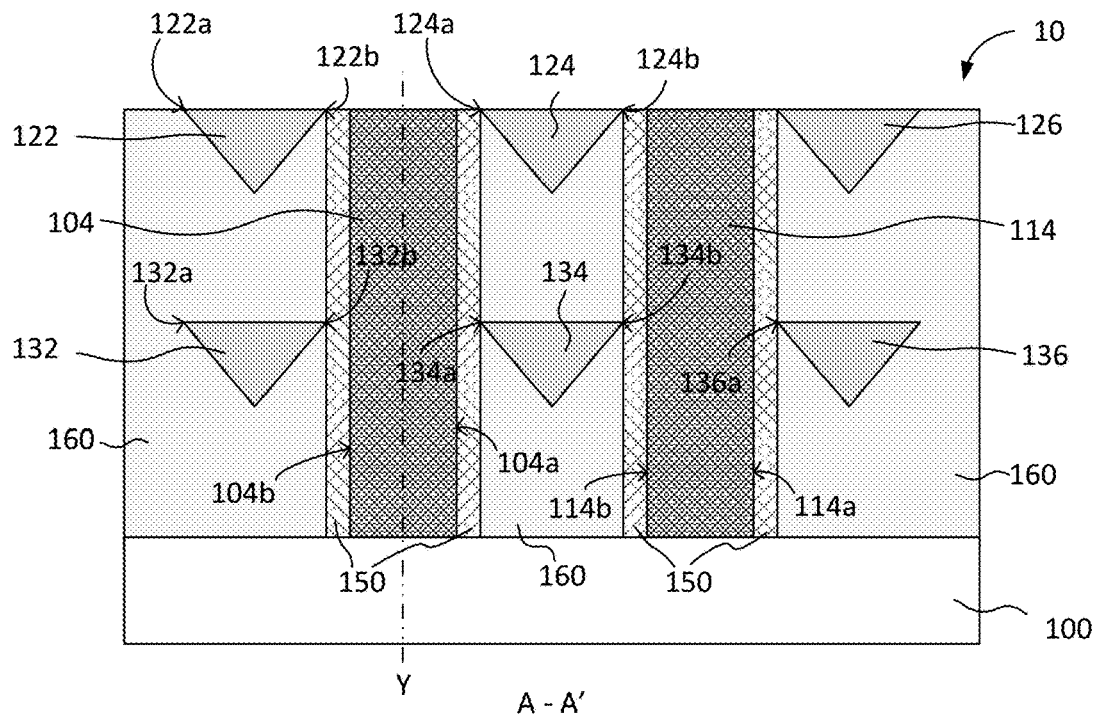
FIG. 2A and FIG. 2B show simplified cross-sectional and perspective views, respectively, of the exemplary embodiment in FIG. 1 according to an aspect of the invention.

Referring now to FIG. 2A in which like reference numerals refer to like features in FIG. 1 and which shows an exemplary cross-section view of memory device 10 taken along dotted line A-A' in FIG. 1. A first vertical electrode 104 comprises edges 104a and 104b, and a second vertical electrode 114 comprises edges 114a and 114b. Similarly, a first horizontal electrode 122 comprises edges 122a and 122b, and a second horizontal electrode 124 comprises edges 124a and 124b. It may be understood that each of the vertical and horizontal electrodes comprise edges as aforementioned and need not be described in further detail. The first horizontal electrode is positioned adjacent to a first side of the first vertical electrode 104 such that a first portion of edge 104b faces and is proximal to a first portion of edge 122b. The second horizontal electrode 124 is positioned adjacent to a second side of the first vertical electrode 104 such that a first portion of edge 104a faces and is proximal to a portion of the edge 124a. A third horizontal electrode 132 having edges 132a and 132b is positioned below the first horizontal electrode 122 such that a second portion of edge 104b faces and is proximal to a portion of edge 132b on the third horizontal electrode 132. A second vertical electrode 114 having edges 114a and 114b is positioned on a side of the second horizontal electrode 124 different from the side adjacent to the first vertical electrode 104, such that a first portion of edge 114b faces and is proximal to a portion of the edge 124b, and a second portion of edge 114b faces and is proximal to a portion of the edge 134b on a fourth horizontal electrode 134 positioned below the second horizontal electrode 124.

For each of the vertical electrodes 102, 104, 106, 112, 114 and 116, a switching layer 150 may be positioned adjacent to the vertical electrode such that a portion of the switching layer 150 is positioned between the vertical electrode and at least one of the horizontal electrodes 132, 134 and 136. In another embodiment, the switching layer may instead be positioned adjacent to the horizontal electrode, for example, the second electrode. In an aspect of the invention, the switching layer 150 may directly contact at least one of the horizontal and vertical electrodes. The switching layer may be conformally deposited onto one or more side surfaces of the vertical or horizontal electrode with a nominally uniform thickness. Suitable materials for the switching layer comprise a metal oxide, such as magnesium oxide, tantalum oxide, hafnium oxide, titanium oxide, aluminum oxide, or silicon dioxide. The switching layer may not need to cover the entire side surface or all of the side surfaces of the electrode, as long as a portion of the switching layer is positioned between a first electrode, which may be a vertical electrode, and a second electrode, which may be a horizontal electrode. In a preferred embodiment, a first portion of the switching layer is positioned between a first electrode portion on a first electrode, for example, a first electrode edge, and a second electrode portion on a second electrode. For example, FIG. 2A shows a switching layer 150 positioned adjacent to a first vertical electrode 104, such that a first portion of the switching layer 150 is positioned between a first electrode portion on first vertical electrode 104 and a second electrode portion on a first horizontal electrode 122. In an embodiment, the first electrode portion may be a first edge portion, for example, a portion of edge 104*b* and the second electrode portion may be a second edge portion, for example, a portion of edge 122*b*. In another example, the first electrode portion may be a portion of edge 104*a* of the first vertical electrode 104 and the second electrode portion may be a portion of edge 124*a* on the second horizontal electrode 124. In another preferred embodiment, a second portion of the switching layer is positioned between a second electrode portion on a first electrode and a third electrode portion on a third electrode. For example, the second electrode portion on the first electrode may be a portion of edge 104*b* on the first vertical electrode 104 and the third electrode portion may be a portion of edge 132*b* on the third horizontal electrode 132. In another example, the second electrode portion on the first electrode may be another portion of edge 104*a* on the first vertical electrode 104 and the third electrode portion may be a portion of edge 134*a* on the fourth horizontal electrode 134. In preferred embodiments, the switching layer is in contact with at least of the electrode edges. For example, a portion of the switching layer is in contact with at least a portion of the edge on a horizontal electrode of memory device 10. In another example, a portion of the switching layer is in contact with at least a portion of the edge on a vertical electrode of memory device 10.

Figure 2B:
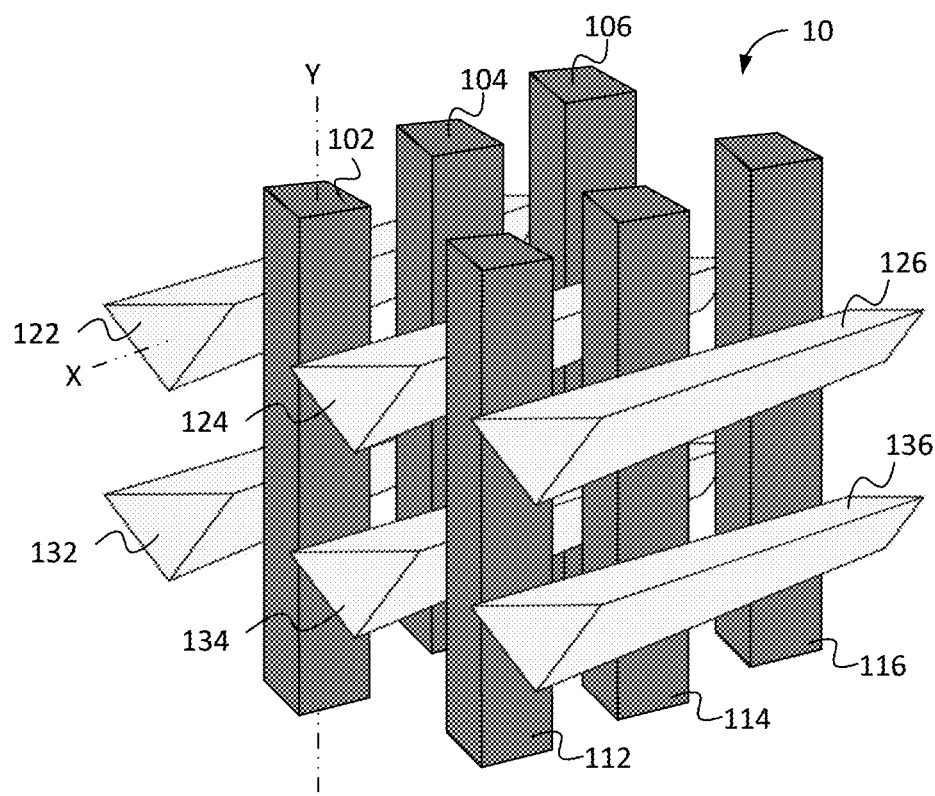

With reference to FIG. 2B in which like reference numerals refer to like features in FIG. 1 and FIG. 2A, an exemplary simplified perspective view of memory device 10 is provided according to an embodiment of the invention. A first array of electrodes may comprise a first row of vertical electrodes 102, 104 and 106, and a second row of vertical electrodes 112, 114 and 116, the first and second rows of vertical electrodes being parallel to and laterally displaced from each other. A second array of electrodes may comprise a first row of horizontal electrodes 122, 124 and 126, and a second row of horizontal electrodes 132, 134 and 136, the first and second rows of vertical electrodes being parallel to and vertically displaced from each other. The switching layer adjacent to each of the vertical electrodes and the interlayer dielectric material as aforementioned are not shown here so as not to obscure the relative configuration of the electrodes.

Figure 2C:
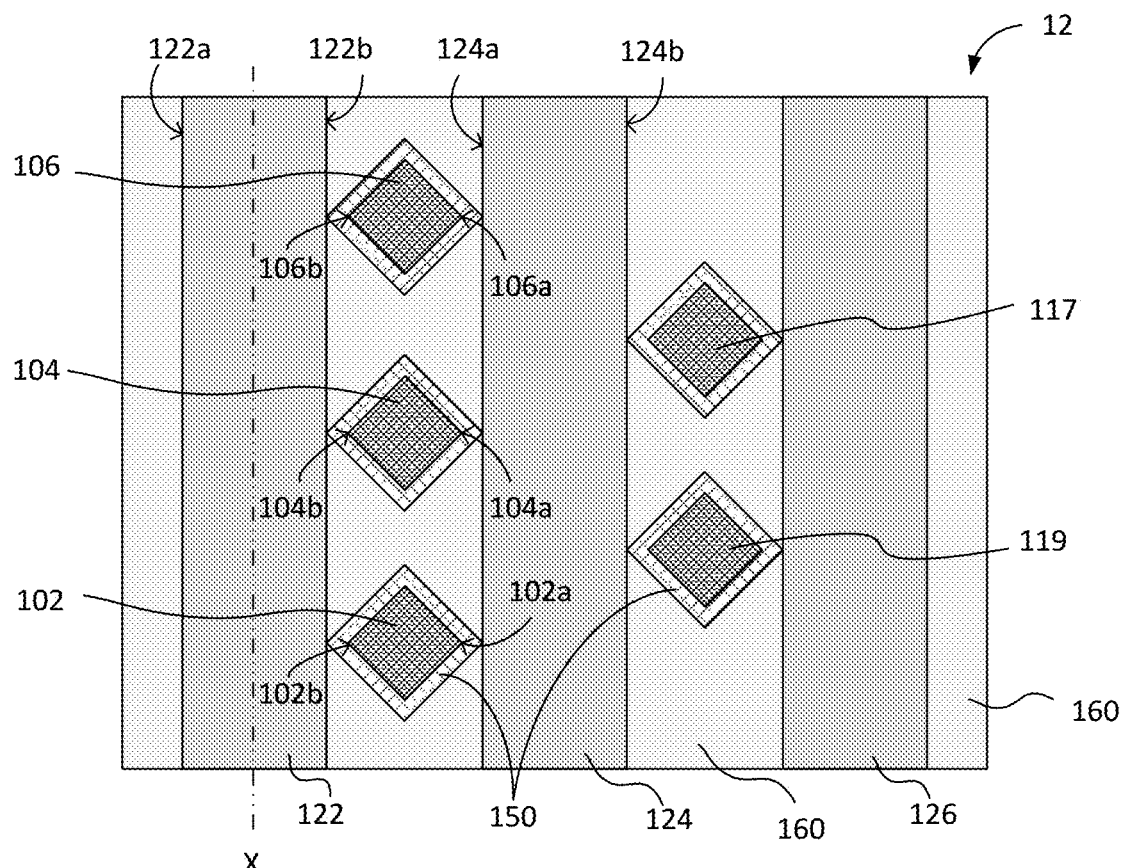
FIG. 2C show simplified top-down view of an alternative embodiment according to another aspect of the invention.

FIG. 2C shows a top view of memory device 12, in which like reference numerals refer to like features in FIG. 1 and which is an alternative exemplary embodiment of the invention as an alternative electrode configuration to that of FIG. 1. As shown, the first row of vertical electrodes 102, 104 and 106 may be in staggered configuration with the second row of vertical electrodes 117 and 119.

In use, the vertical and horizontal electrodes may be connected to other interconnect structures such vias and conductive lines for sending or receiving electrical inputs from other electronic components such as transistors or diodes, as non-limiting examples, in a memory device. The interconnect structures may comprise a metallic material such as copper, cobalt, aluminum, or an alloy thereof. The conductive lines may be source lines, bit lines, or word lines, and each conductive line may be connected to more than one vertical or horizontal electrode, depending on the design requirements of the device. In use, voltages may be applied to the vertical and horizontal electrodes through the conductive lines, in order to read, write or erase the memory device. For example, memory device 10 may have a first bit line connected to the first horizontal electrode 122, and a second bit line connected to the second horizontal electrode 124. A word line may be connected to the first vertical electrode 102. Upon application of desired voltages to horizontal and vertical electrodes as required for operation of the memory device, one or more conductive filaments may be formed in a portion of the switching layer between a first electrode and a second electrode, so as to form a conductive path between the first and second electrodes. The switching layer may be configured to switch between a low resistance state (LRS) and a high resistance state (HRS) through the formation and destruction of the conductive filament(s). Confinement of the conductive filaments to a specific region of the switching layer by intentional design allows for faster switching behavior between high resistance state (HRS) and low resistance state (LRS), as opposed to conductive filaments forming randomly within the switching layer in an unpredictable manner. As such, in accordance with an aspect of the invention, a portion of the switching layer is positioned between a first electrode and a second electrode perpendicular to the first electrode such that conductive filaments may be confined to a specific region. For example, with reference to memory device 10 in accordance with an embodiment of the invention, conductive filaments are confined to the specific portion of the switching layer 150 that is between an edge portion of first vertical electrode 102 and an edge portion of first horizontal electrode 122. The confinement of conductive filaments to a specific region allows for faster switching behavior and which translates to faster reading, writing and erasing of the memory device. Additionally, due to the interleaved structure of the vertical and horizontal electrodes, two or more memory cells can share a common electrode but may provide independent memory outputs. For example, the first vertical electrode 102 is a common electrode and forms memory cells with horizontal electrodes 122, 124, 132 and 134, all of which may be connected to separate bit lines.

Figure 3A:
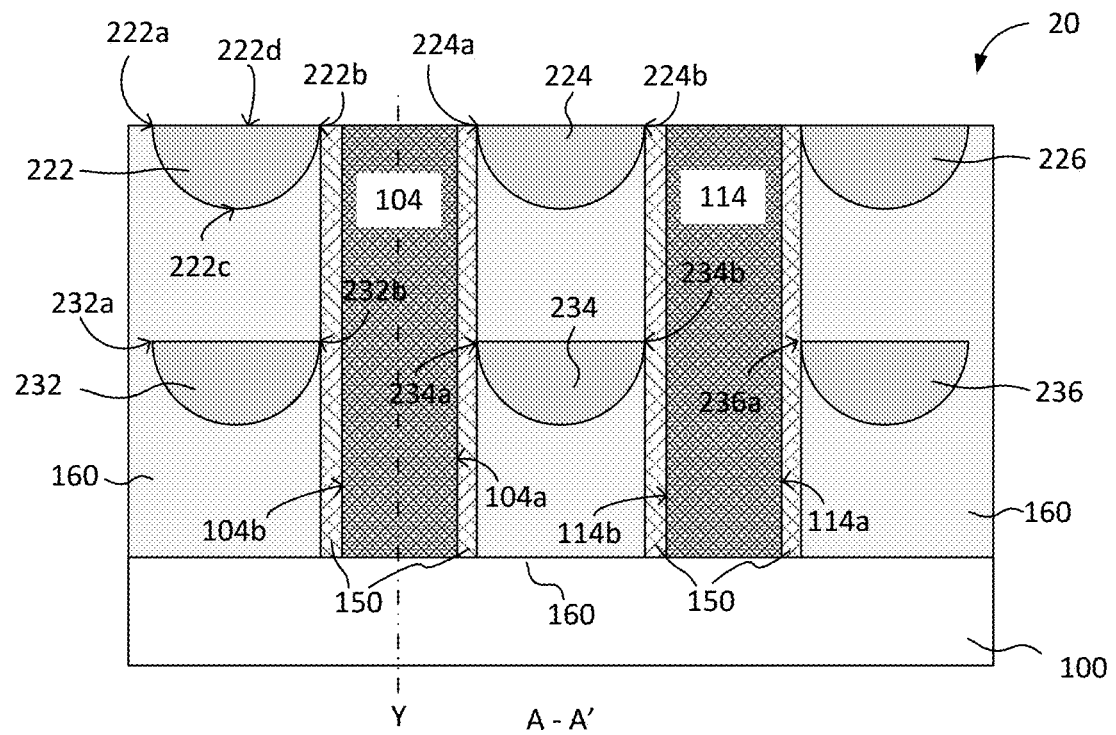
FIG. 3A and FIG. 3B show simplified cross-sectional and perspective views, respectively, of the exemplary embodiment in FIG. 1 according to another aspect of the invention.

With reference to FIG. 3A, in which like reference numerals refer to like features in FIG. 2A, a memory device 20 is provided in accordance with an alternative embodiment having a similar top view to the memory device of FIG. 1. The exemplary cross-section of memory device 20 is similarly taken along dotted line A-A' of FIG. 1. Memory device 20 may include features similar to memory device 10, including vertical electrodes 102, 104, 106, 112, 114 and 116, switching layers 150 and interlayer dielectric material 160 as already described and need not be repeated here. Memory device 20 may have a first row of horizontal electrodes 222, 224, 226 and a second row of horizontal electrodes 232, 234 and 236, in place of the horizontal electrodes 122, 124, 126, 132, 134 and 136. The horizontal electrodes of memory device 20 may each have a substantially semicircular cross-section when viewed along the X-axis and comprises a curved side surface, a substantially flat surface, and edges along the X-axis. For example, a first horizontal electrode 222 comprises a curved side surface 222*c*, a substantially flat surface 222*d*, and edges 222*a* and 222*b* along the X-axis. It may be understood that each of the horizontal electrodes comprise side surfaces and edges similar to those of the first horizontal electrode 222 as aforementioned and need not be described in further detail. The horizontal electrodes in memory device 20 are positioned relative to the switching layers and the vertical electrodes in a similar configuration as that of memory device 10 such that the positions of the electrode portions on the horizontal electrodes relative to the switching layer 150 and the electrode portions on the vertical electrodes are similar as have been described for memory device 10, in order to achieve confinement of conductive filaments to a specific region. For example, with reference to memory device 20, conductive filaments are confined to a portion of the switching layer 150 that is between an edge portion of first vertical electrode 102 and an edge portion of first horizontal electrode 222. In a further example, filament confinement may be achieved in a first portion of the switching layer 150 positioned between a portion of edge 104*b* of first vertical electrode 104 that faces and is proximal to a portion of edge 222*b* of the first horizontal electrode 222. Filament confinement may also be achieved in a second portion of the switching layer positioned between another portion of edge 104*b* of first vertical electrode 104 that faces and is proximal to a portion of edge 232*b* on the second horizontal electrode 232. In another example, the second portion of the switching layer may be positioned between a portion of edge 104*a* on the first vertical electrode that faces and is proximal to a portion of edge 234*a* on a third horizontal electrode 234, and filament confinement may occur therein. In preferred embodiments, the switching layer is in contact with at least one of the electrode portions. For example, a portion of the switching layer is in contact with at least a portion of the edge on a horizontal electrode of memory device 20. In another example, a portion of the switching layer is in contact with at least a portion of the edge on a vertical electrode of memory device 20.

Figure 3B:
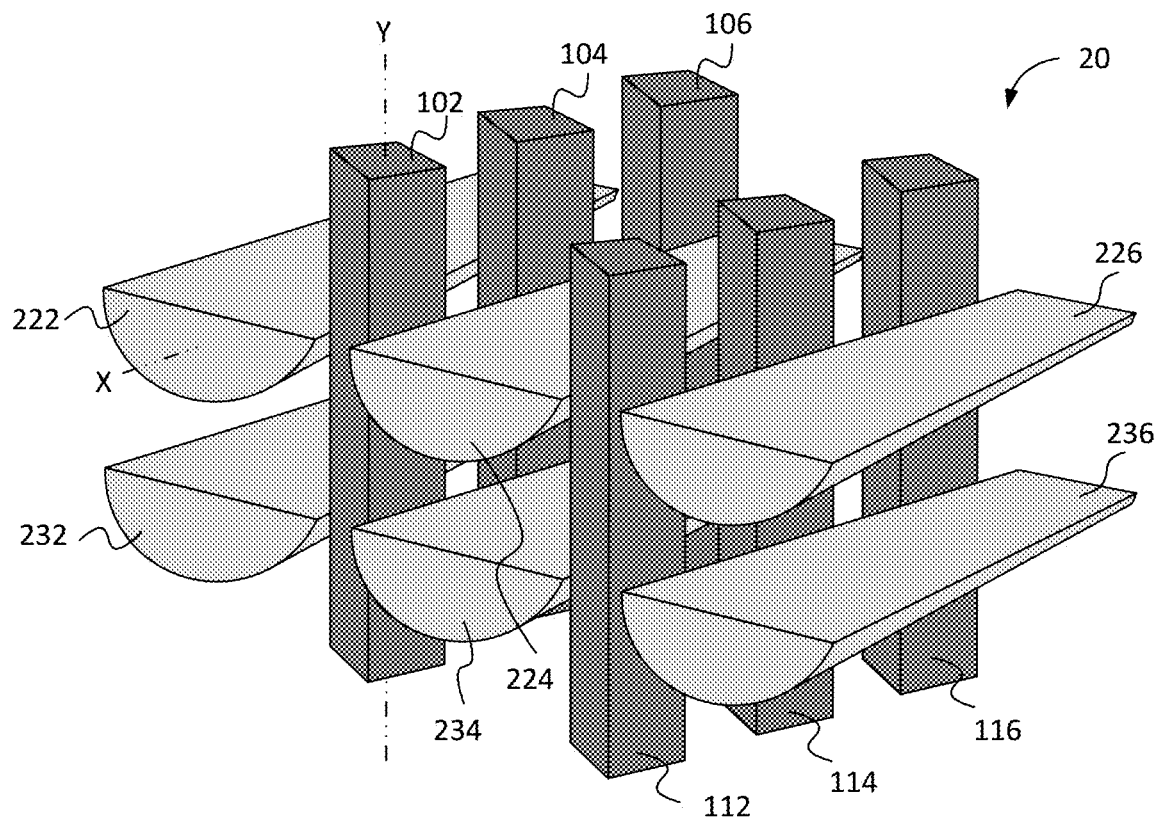

FIG. 3B shows an exemplary simplified perspective view of memory device 20 having a similar configuration to FIG. 2B except that the horizontal electrodes 122, 124, 126, 132, 134 and 136 are replaced with horizontal electrodes 222, 224, 226, 232, 234 and 236 each having a substantially semicircular cross-section. The switching layer and the interlayer dielectric material are not shown in FIG. 3B so as not to obscure the relative configuration of the electrodes.

Figure 4A:
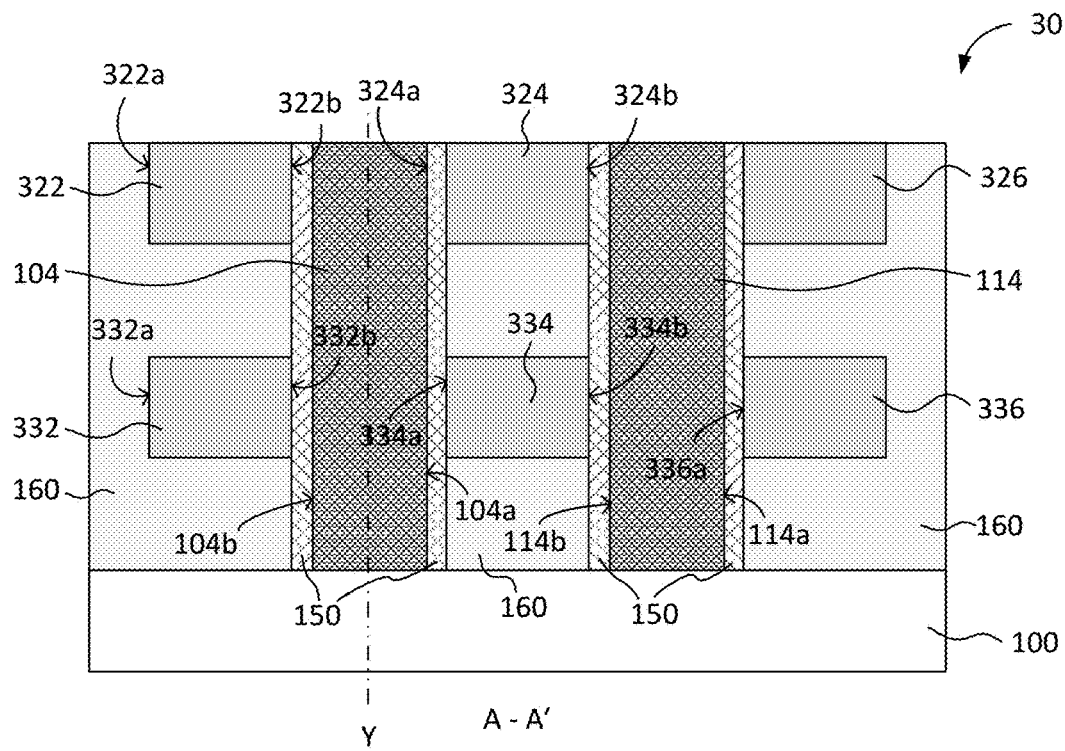
FIG. 4A and FIG. 4B show simplified cross-sectional and perspective views, respectively, of the exemplary embodiment in FIG. 1 according to yet another aspect of the invention.

With reference to FIG. 4A, in which like reference numerals refer to like features in FIG. 2A, a memory device 30 is provided in accordance with an alternative embodiment having a similar top view to the memory device of FIG. 1. The exemplary cross-section of memory device 30 is similarly taken along dotted line A-A' of FIG. 1. Memory device 30 may include features similar to memory device 10, including vertical electrodes 102, 104, 106, 112, 114 and 116, switching layers 150 and interlayer dielectric material 160 as already described and need not be repeated here. Memory device 30 may have a first row of horizontal electrodes 322, 324, 326 and a second row of horizontal electrodes 332, 334 and 336, in place of the horizontal electrodes 122, 124, 126, 132, 134 and 136. In one aspect of the embodiment, the horizontal electrodes of memory device 30 may have cross-sections that are substantially rectangular, square or trapezoidal-shaped when viewed along the X-axis. In another aspect of the embodiment, the horizontal electrodes have substantially flat bottom surfaces and substantially vertical side surfaces along the X-axis. In yet another aspect of the embodiment, the horizontal electrodes may have non-flat bottom surfaces and sloped sidewalls, as well as one or more rounded edges due to processing limitations. For example, a first horizontal electrode 322 having side surfaces 322*a* and 322*b*, is positioned adjacent to a first side of the first vertical electrode 104 having edges 104*a* and 104*b* such that a first portion of edge 104*b* faces and is proximal to a portion of side surface 322*b*. The second horizontal electrode 324 having side surfaces 324*a* and 324*b*, is positioned adjacent to a second side of the first vertical electrode 104 such that a first portion of edge 104*a* faces and is proximal to a portion of the side surface 324*a*. A third horizontal electrode 332 having side surfaces 332*a* and 332*b* is positioned below the first horizontal electrode 322 such that a second portion of edge 104*b* faces and is proximal to a portion of side surface 332*b* on the third horizontal electrode 332. It may be understood that some or all of the horizontal electrodes similarly comprise a first and second side surfaces as aforementioned and need not be described in further detail. The horizontal electrodes in memory device 30 are positioned relative to the switching layers and the vertical electrodes in a similar configuration as that of memory device 10 such that the positions of the electrode portions on the horizontal electrodes relative to the switching layer 150 and the electrode portions on the vertical electrodes are similar as have been described for memory device 10, in order to achieve confinement of conductive filaments to a specific region. For example, with reference to memory device 30, conductive filaments are confined to a portion of the switching layer 150 that is between an edge portion of first vertical electrode 104 and a side surface portion of first horizontal electrode 322. In a further example, filament confinement may be achieved in a first portion of the switching layer positioned between a portion of edge 104*b* of first vertical electrode 104 that faces and is proximal to a portion of side surface 322*b* of the first horizontal electrode 322. Filament confinement may also be achieved in a second portion of the switching layer positioned between another portion of edge 104*b* of first vertical electrode 104 that faces and is proximal to a portion of side surface 332*b* on the second horizontal electrode 332. In another example, the second portion of the switching layer may be positioned between a portion of edge 104*a* on the first vertical electrode that faces and is proximal to a portion of side surface 334*a* on a third horizontal electrode 334, and filament confinement may occur therein. In preferred embodiments, the switching layer is in contact with at least one of the electrode portions. For example, a portion of the switching layer is in contact with at least a side surface of a horizontal electrode of memory device 30. In another example, a portion of the switching layer is in contact with at least a portion of the edge on a vertical electrode of memory device 30.

Figure 4B:
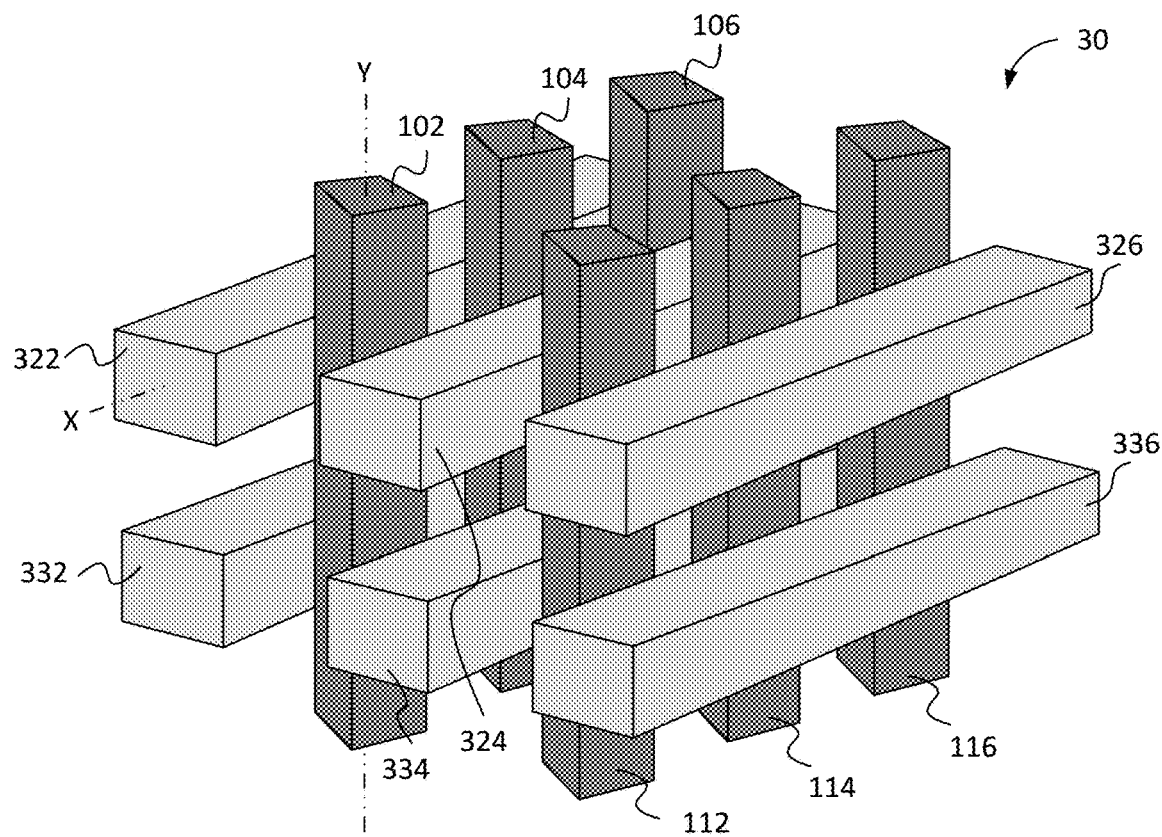

FIG. 4B shows an exemplary simplified perspective view of memory device 30 having a similar configuration to FIG. 2B except that the horizontal electrodes 122, 124, 126, 132, 134 and 136 are replaced with horizontal electrodes 322, 324, 326, 332, 334 and 336 each having a substantially rectangular or square-shaped cross-section. The switching layer and the interlayer dielectric material are not shown in FIG. 4B so as not to obscure the relative configuration of the electrodes.

Figure 5:
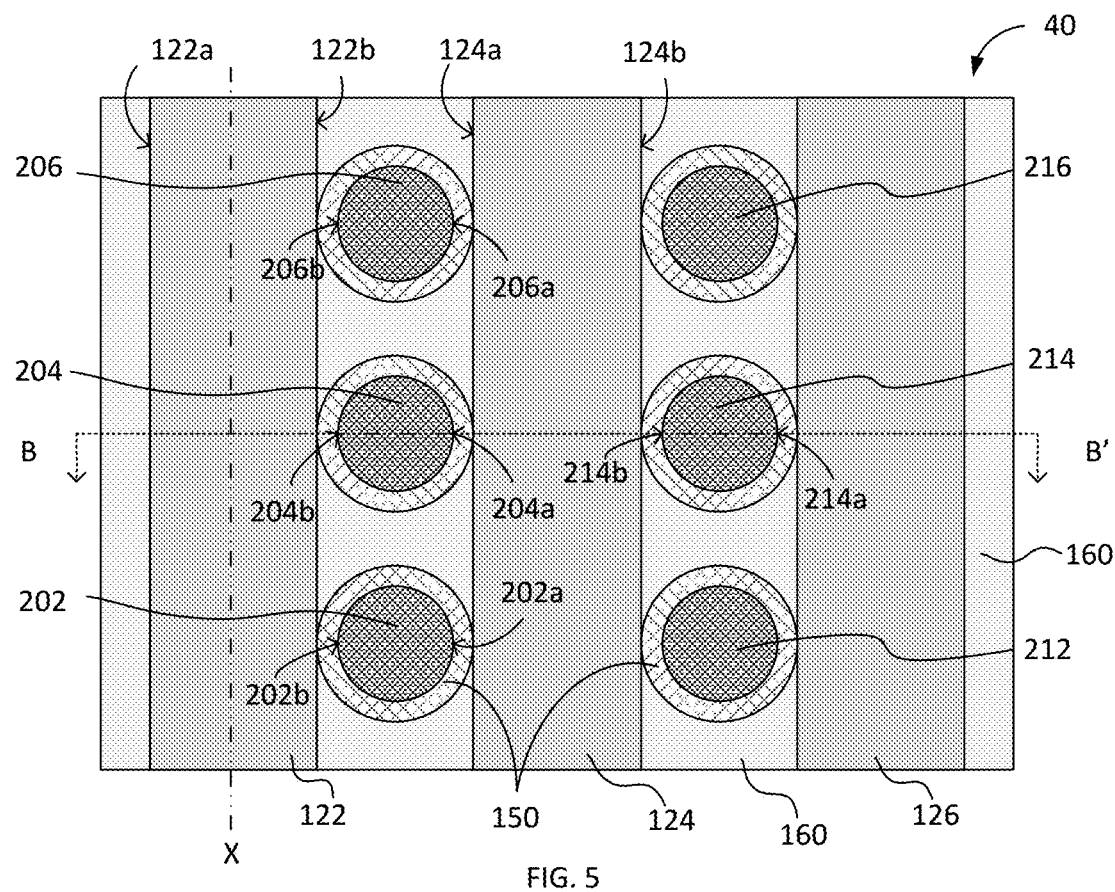
FIG. 5 shows a simplified top-down view of a memory device according to another exemplary embodiment of the invention.

With reference to FIG. 5, in which like reference numerals refer to like features in FIG. 1, a memory device 40 is provided in accordance with an alternative embodiment.

Memory device 40 may include features similar to memory device 10, including horizontal electrodes 122, 124, 126, 132, 134 and 136, switching layers 150 and interlayer dielectric material 160 as already described and need not be repeated here. Memory device 40 may have a first row of vertical electrodes 202, 204, 206 and a second row of vertical electrodes 212, 214 and 216, in place of the vertical electrodes 102, 104, 106, 112, 114 and 116 of memory device 10. Each of the vertical electrodes may have a polygonal cross-section when viewed along the Y-axis. In another aspect of the embodiment, the vertical electrodes have side surfaces which are substantially curved and have lengths extending along the Y-axis. For example, the polygonal cross-section may be shaped like a circle. In other examples, the polygonal cross-section may be elliptical or oval shaped.

Figure 6A:
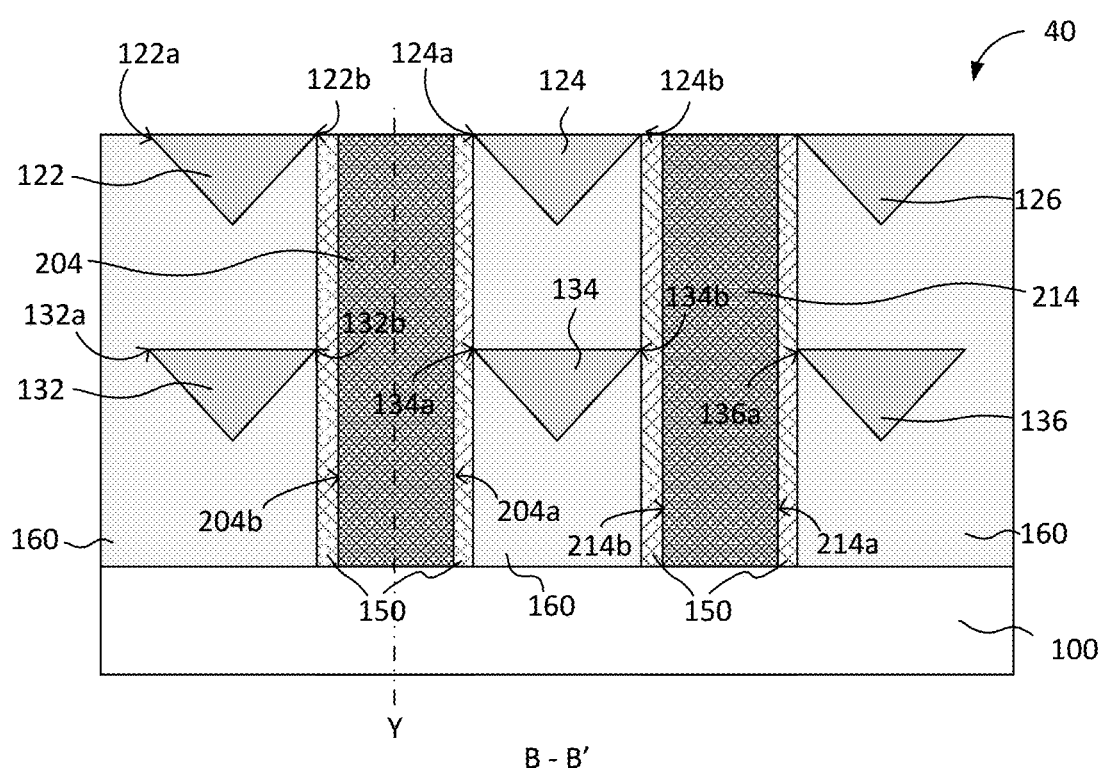
FIG. 6A and FIG. 6B show simplified cross-sectional and perspective views, respectively, of the exemplary embodiment in FIG. 5 according to an aspect of the invention.

Referring now to FIG. 6A in which like reference numerals refer to like features in FIG. 5 and which shows an exemplary cross-section view of memory device 40 taken along dotted line B-B' in FIG. 5. A first horizontal electrode 122 having edges 122a and 122b, is positioned adjacent to a first side of the first vertical electrode 204 having side surfaces 204a and 204b such that a first portion of side surface 204b faces and is proximal to a portion of edge 122b. The second horizontal electrode 124 having edges 124a and 124b, is positioned adjacent to a second side of the first vertical electrode 204 such that a first portion of edge 204a faces and is proximal to a portion of edge 124a. A third horizontal electrode 132 having edges 132a and 132b is positioned below the first horizontal electrode 122 such that a second portion of side surface 204b faces and is proximal to a portion of edge 132b. It is understood that each of the vertical electrodes comprise similar side surfaces as aforementioned and need not be described in further detail. The horizontal electrodes in memory device 40 are similarly positioned relative to the switching layers and the vertical electrodes in a similar configuration as that of memory device 10 such that the positions of the electrode portions on the horizontal electrodes relative to the switching layer 150 and the electrode portions on the vertical electrodes are similar as have been described for memory device 10, in order to achieve confinement of conductive filaments to a specific region. For example, with reference to memory device 40, conductive filaments are confined to a portion of the switching layer 150 that is between an edge portion of first vertical electrode 204 and a side surface portion of first horizontal electrode 122. In a further example, filament confinement may be achieved in a first portion of the switching layer positioned between a portion of side surface 204b of first vertical electrode 204 that faces and is proximal to a portion of edge 122b of the first horizontal electrode 122. Filament confinement may also be achieved in a second portion of the switching layer positioned between another portion of side surface 204b of first vertical electrode 204 that faces and is proximal to a portion of edge 132b on the second horizontal electrode 132. In another example, the second portion of the switching layer may be positioned between a portion of side surface 204a on the first vertical electrode that faces and is proximal to a portion of edge 134a on a third horizontal electrode 134, and filament confinement may occur therein. In preferred embodiments, the switching layer is in contact with at least one of the electrode portions. For example, a portion of the switching layer is in contact with at least a portion of the side surface of a vertical electrode of memory device 40. In another example, a portion of the switching layer is in contact with at least a portion of the edge on a horizontal electrode of memory device 40.

Figure 6B:
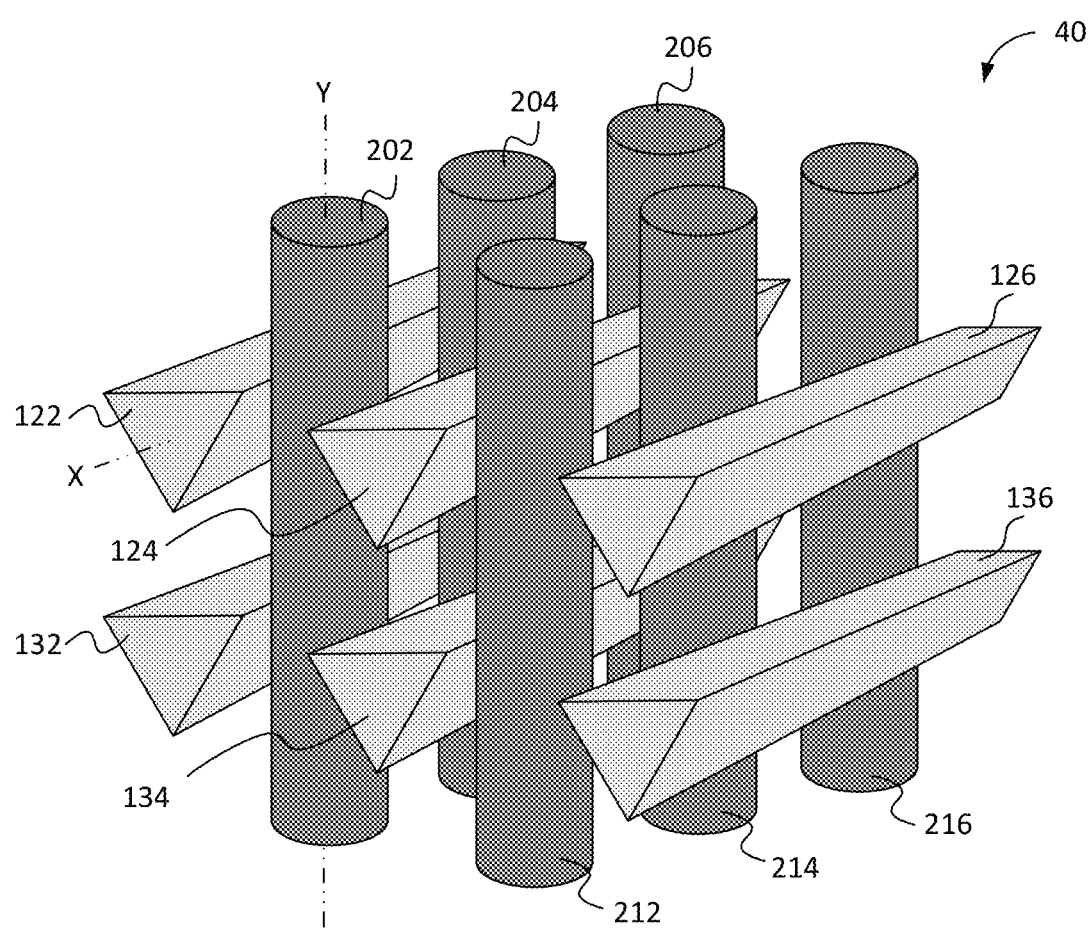

FIG. 6B shows an exemplary simplified perspective view of memory device 40 having a similar configuration to FIG. 2B except that the vertical electrodes 102, 104, 106, 112, 114 and 116 are replaced with vertical electrodes 202, 204, 206, 212, 214 and 216 each having a substantially circular cross-section. The switching layer and the interlayer dielectric material are not shown in FIG. 6B so as not to obscure the relative configuration of the electrodes.

Figure 7A:
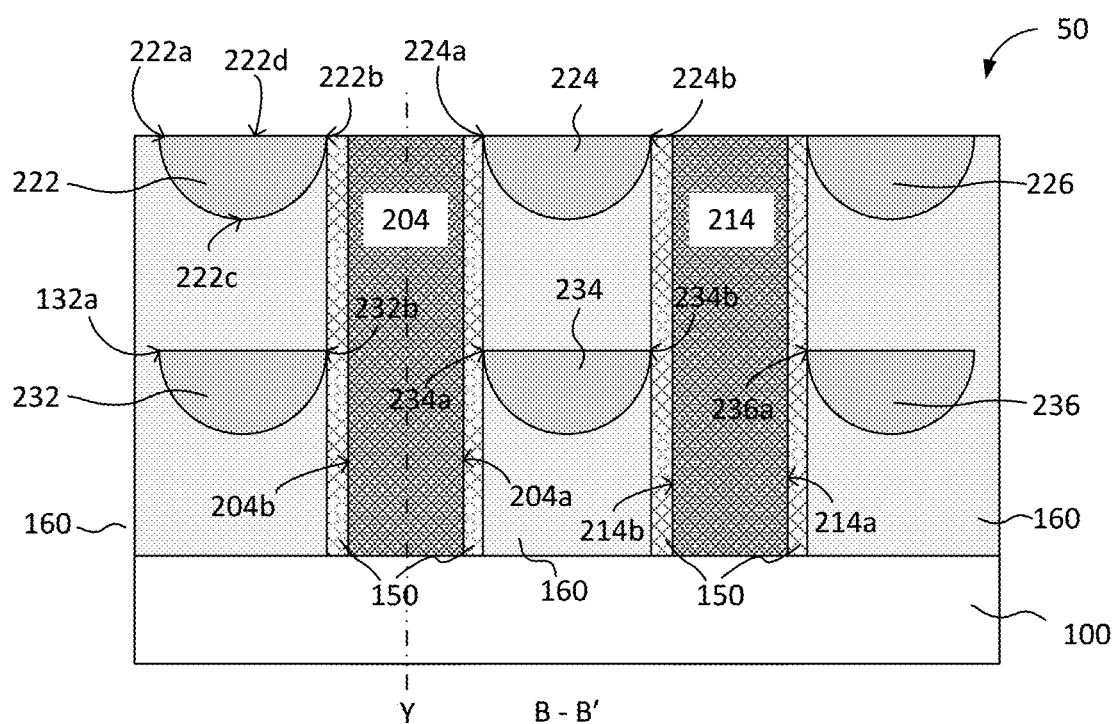
FIG. 7A and FIG. 7B show simplified cross-sectional and perspective views, respectively, of the exemplary embodiment in FIG. 5 according to another aspect of the invention.

With reference to FIG. 7A, in which like reference numerals refer to like features in FIG. 6A, a memory device 50 is provided in accordance with an alternative embodiment having a similar top view to the memory device of FIG. 5. The exemplary cross-section of memory device 50 is similarly taken along dotted line B-B' of FIG. 5. Memory device 50 may include features similar to memory device 40, including vertical electrodes 202, 204, 206, 212, 214 and 216, switching layers 150 and interlayer dielectric material 160 as already described and need not be repeated here. Memory device 50 may have a first row of horizontal electrodes 222, 224, 226 and a second row of horizontal electrodes 232, 234 and 236, in place of the horizontal electrodes 122, 124, 126, 132, 134 and 136. The horizontal electrodes of memory device 50 are similar to the horizontal electrodes of memory device 20 as shown in FIGS. 3A and 3B, and may each have a substantially semicircular cross-section when viewed along the X-axis and comprises a curved side surface, a substantially flat surface, and edges along the X-axis. The horizontal electrodes in memory device 50 are positioned relative to the switching layers and the vertical electrodes in a similar configuration as that of memory device 40 as described earlier for FIGS. 6A and 6B such that the positions of the electrode portions on the horizontal electrodes relative to the switching layer 150 and the electrode portions on the vertical electrodes are similar as have been described for memory device 40, in order to achieve confinement of conductive filaments to a specific region. For example, with reference to memory device 50, conductive filaments are confined to a portion of the switching layer 150 positioned between a side surface portion of first vertical electrode 204 and an edge portion of first horizontal electrode 222. In a further example, filament confinement may be achieved in a first portion of the switching layer 150 positioned between a portion of side surface 204b of first vertical electrode 204 that faces and is proximal to a portion of edge 222b of the first horizontal electrode 222. Filament confinement may also be achieved in a second portion of the switching layer positioned between another portion of side surface 204b of first vertical electrode 204 that faces and is proximal to a portion of edge 232b on the second horizontal electrode 232. In another example, the second portion of the switching layer may be positioned between a portion of side surface 204a on the first vertical electrode that faces and is proximal to a portion of edge 234a on a third horizontal electrode 234, and filament confinement may occur therein. In preferred embodiments, the switching layer is in contact with at least one of the electrode portions. For example, a portion of the switching layer is in contact with at least a portion of the edge of a horizontal electrode of memory device 50. In another example, a portion of the switching layer is in contact with at least a portion of the edge on a vertical electrode of memory device 50.

Figure 7B:
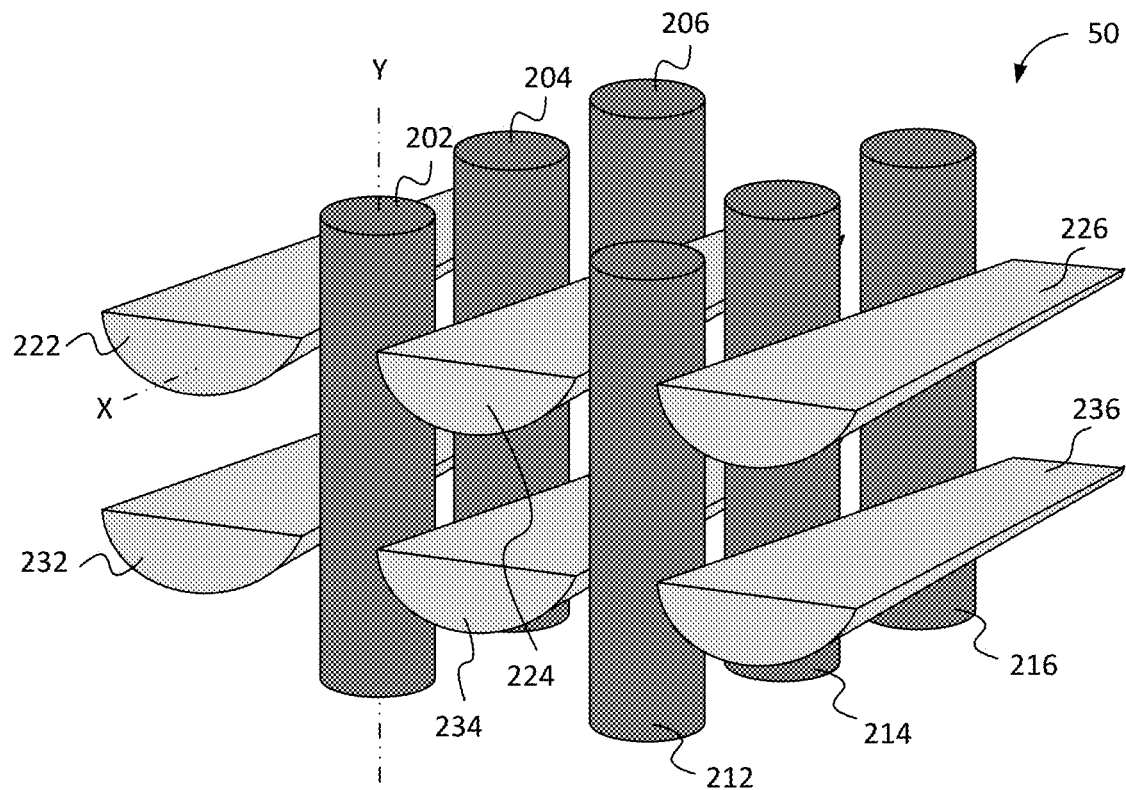

FIG. 7B shows an exemplary simplified perspective view of memory device 50 having a similar configuration to FIG.

6B except that the horizontal electrodes 122, 124, 126, 132, 134 and 136 are replaced with horizontal electrodes 222, 224, 226, 232, 234 and 236 each having a substantially semicircular cross-section. The switching layer and the interlayer dielectric material are not shown in FIG. 7B so as not to obscure the relative configuration of the electrodes.

Figure 8:
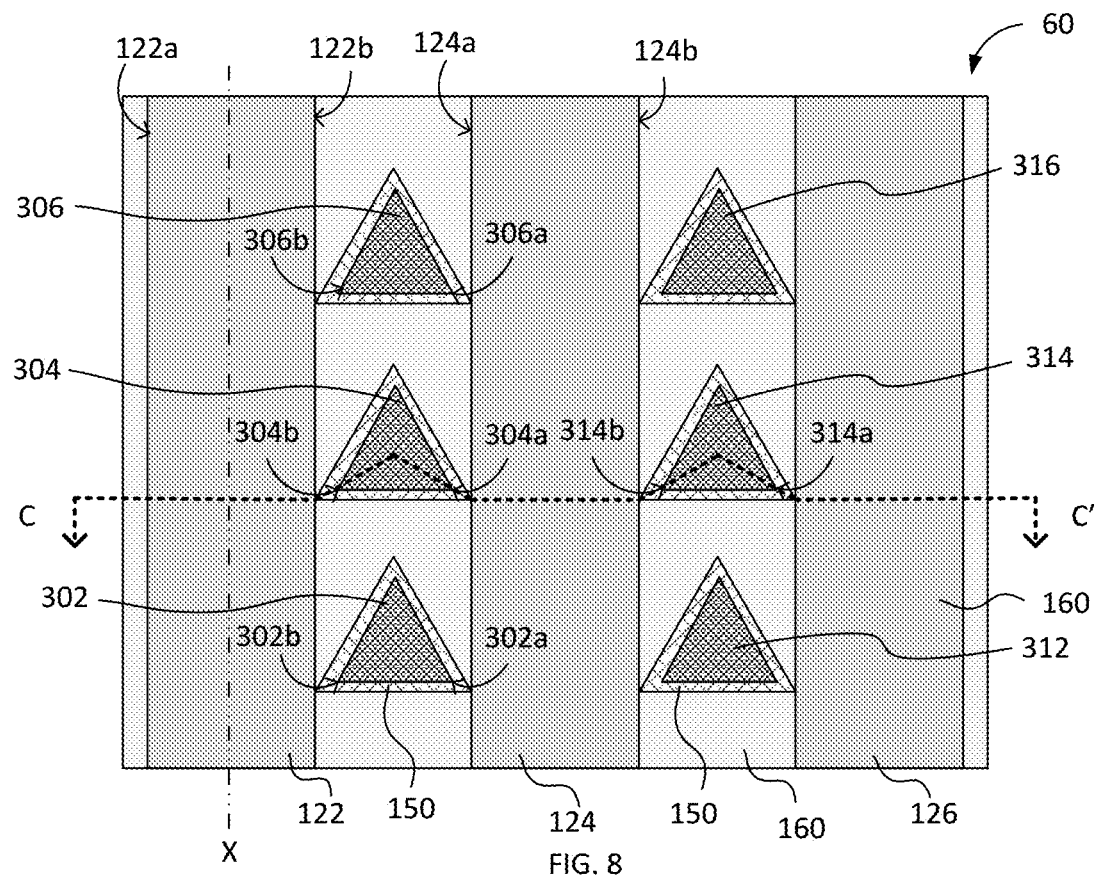
FIG. 8 shows a simplified top-down view of a memory device according to yet another exemplary embodiment of the invention.

With reference to FIG. 8, in which like reference numerals refer to like features in FIG. 1, a memory device 60 is provided in accordance with an alternative embodiment. Memory device 60 may include features similar to memory device 10, including horizontal electrodes 122, 124, 126, 132, 134 and 136, switching layers 150 and interlayer dielectric material 160 as already described and need not be repeated here. Memory device 60 may have a first row of vertical electrodes 302, 304, 306 and a second row of vertical electrodes 312, 314 and 316, in place of the vertical electrodes 102, 104, 106, 112, 114 and 116 of memory device 10. Each of the vertical electrodes may have at least three side surfaces and three edges along Y-axis and may have a polygonal cross-section when viewed along the Y-axis. For example, the polygonal cross-section may be shaped like a triangle.

Figure 9A:
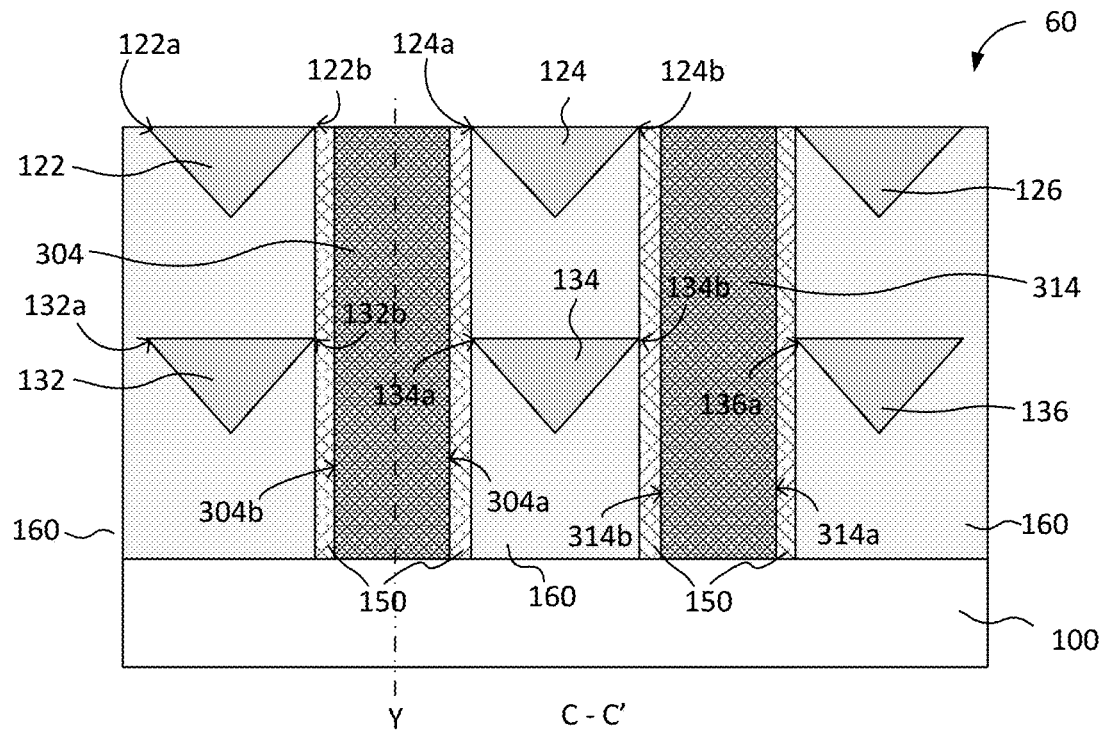
FIG. 9A and FIG. 9B show simplified cross-sectional and perspective views, respectively, of the exemplary embodiment in FIG. 8 according to an aspect of the invention.

Referring now to FIG. 9A in which like reference numerals refer to like features in FIG. 8 and which shows an exemplary cross-section view of memory device 60 taken along dotted line C-C' in FIG. 8. Each of the vertical electrodes comprise side surfaces which meet to form edges along the Y-axis. For example, a first vertical electrode 304 has three side surfaces and three edges, including edges 304a and 304b. The vertical electrodes in memory device 60 are similarly positioned relative to the switching layers and the horizontal electrodes in a similar configuration as that of memory device 10 such that the relative positions of the electrode portions on the horizontal electrodes relative to the switching layer 150 and the electrode portions on the vertical electrodes are similar as have been described for memory device 10, in order to achieve confinement of conductive filaments to a specific region. In an exemplary embodiment, a first portion of the switching layer may be positioned between a first electrode portion on a first electrode and a second electrode portion on a second electrode. For example, with reference to memory device 60, conductive filaments are confined to a portion of the switching layer 150 that is between an edge portion of first vertical electrode 304 and a side surface portion of first horizontal electrode 122. In a further example, filament confinement may be achieved in a first portion of the switching layer 150 positioned between a portion of edge 304b of first vertical electrode 304 that faces and is proximal to a portion of edge 122b of the first horizontal electrode 122. Filament confinement may also be achieved in a second portion of the switching layer 150 positioned between another portion of edge 304b of first vertical electrode 304 that faces and is proximal to a portion of edge 132b on the second horizontal electrode 132. In another example, the second portion of the switching layer 150 may be positioned between a portion of edge 304a on the first vertical electrode 304 that faces and is proximal to a portion of edge 134a on a third horizontal electrode 134, and filament confinement may occur therein. In preferred embodiments, the switching layer is in contact with at least one of the electrode portions. For example, a portion of the switching layer 150 is in contact with at least a portion of the edge of a vertical electrode of memory device 60. In another example, a portion of the switching layer is in contact with at least a portion of the edge on a horizontal electrode of memory device 60.

Figure 9B:
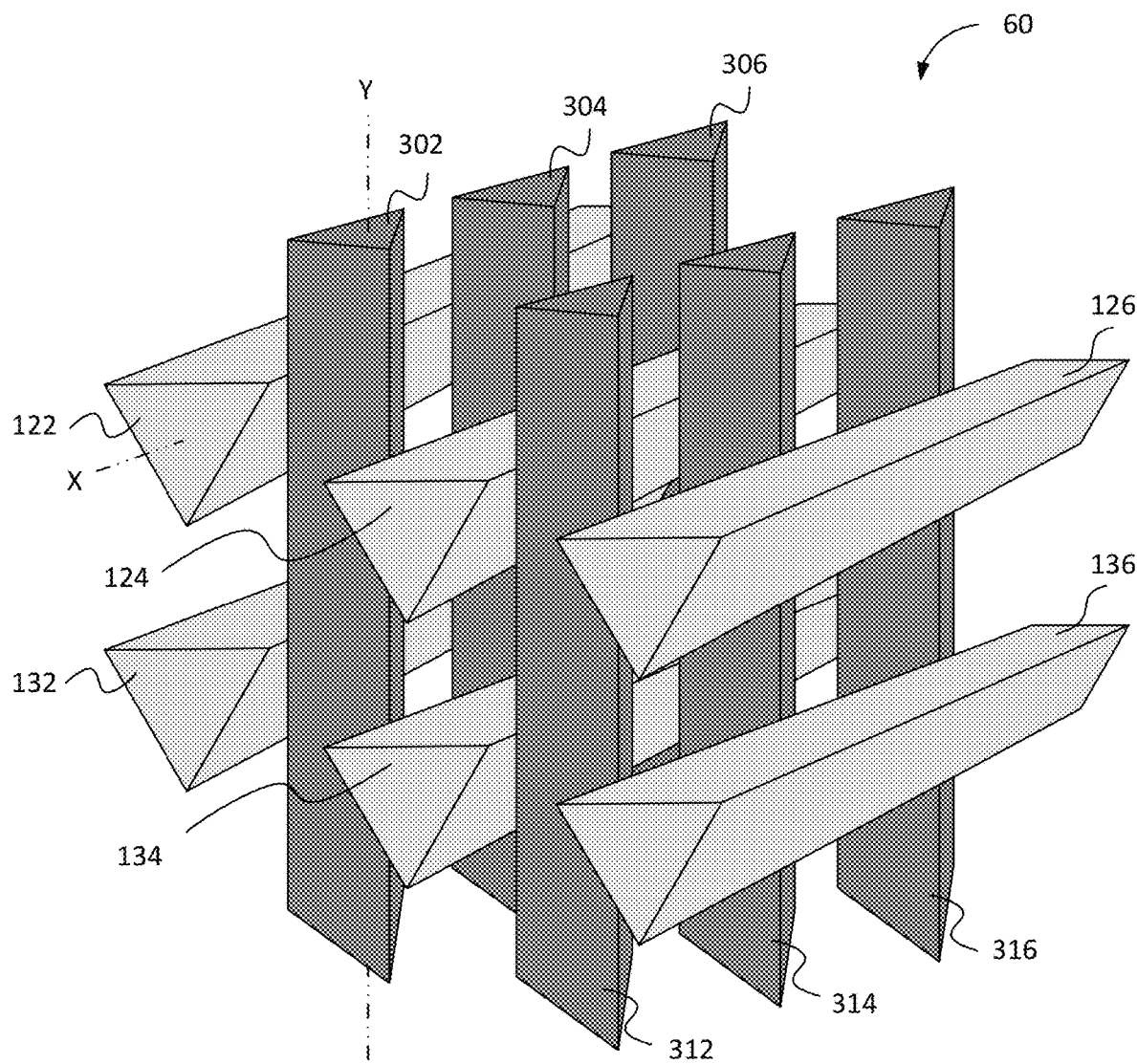

FIG. 9B shows an exemplary simplified perspective view of memory device 60 having a similar configuration to FIG. 2B except that the vertical electrodes 102, 104, 106, 112, 114 and 116 are replaced with vertical electrodes 302, 304, 306, 312, 314 and 316 each having a triangular cross-section. The switching layer and the interlayer dielectric material are not shown in FIG. 9B so as not to obscure the relative configuration of the electrodes.

Figure 10:
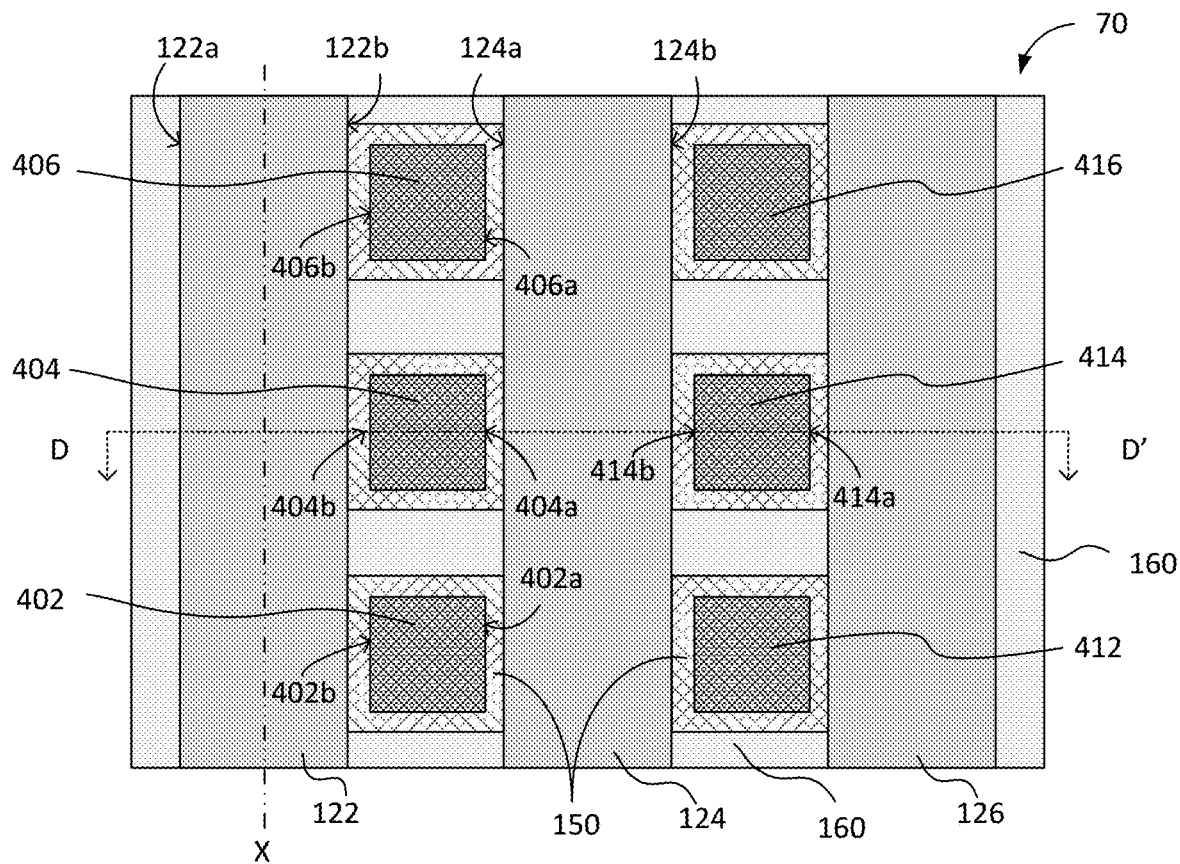
FIG. 10 shows a simplified top-down view of a memory device according to yet another exemplary embodiment of the invention.

With reference to FIG. 10, in which like reference numerals refer to like features in FIG. 1, a memory device 70 is provided in accordance with an alternative embodiment. Memory device 70 may include features similar to memory device 10, including horizontal electrodes 122, 124, 126, 132, 134 and 136, switching layers 150 and interlayer dielectric material 160 as already described and need not be repeated here. Memory device 70 may have a first row of vertical electrodes 402, 404, 406 and a second row of vertical electrodes 412, 414 and 416, in place of the vertical electrodes 102, 104, 106, 112, 114 and 116 of memory device 10. Each of the vertical electrodes may have at least two substantially parallel side surfaces along the Y-axis and may have a polygonal cross-section when viewed along the Y-axis. For example, the polygonal cross-section may be shaped like a rectangle or square.

Figure 11A:
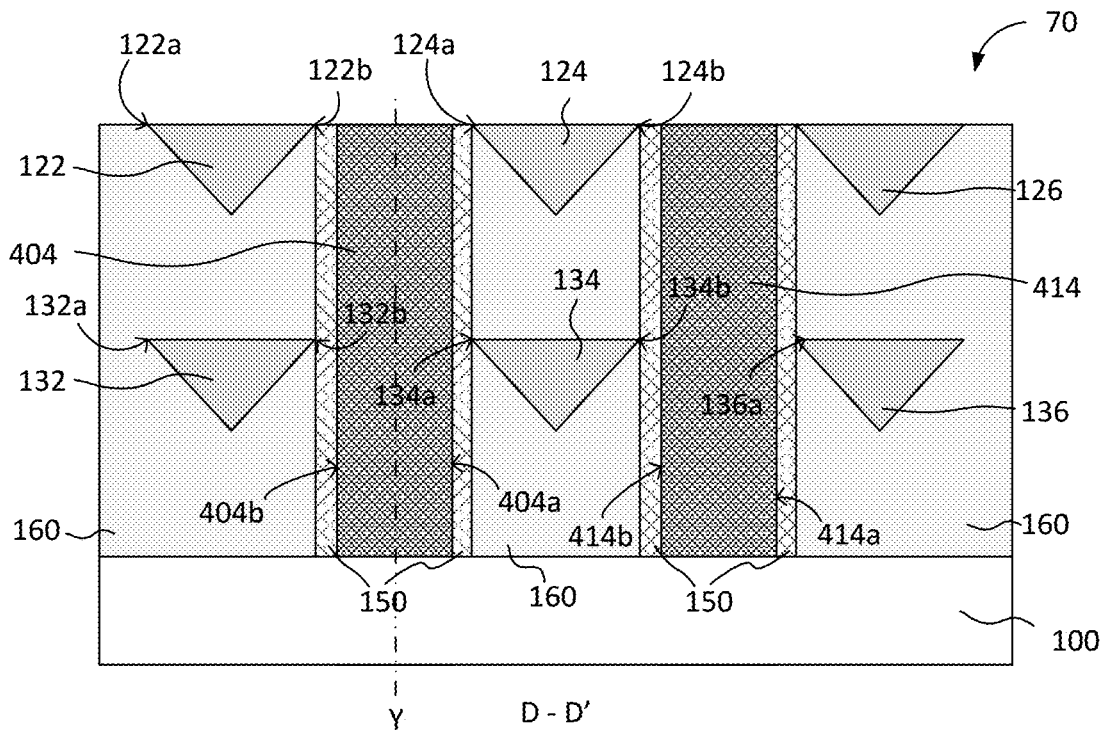
FIG. 11A and FIG. 11B show simplified cross-sectional and perspective views, respectively, of the exemplary embodiment in FIG. 10 according to an aspect of the invention.

Referring now to FIG. 11A in which like reference numerals refer to like features in FIG. 10 and which shows an exemplary cross-section view of memory device 70 taken along dotted line D-D' in FIG. 10. Each of the vertical electrodes comprise substantially parallel side surfaces and polygonal cross-sections which may be rectangular in shape. In another embodiment, the cross-section may be square in shape. For example, a first vertical electrode 404 has substantially parallel side surfaces 404a and 404b. The vertical electrodes in memory device 70 are positioned relative to the switching layers and the horizontal electrodes in a similar configuration as that of memory device 40 such that the positions of the electrode portions on the horizontal electrodes relative to the switching layer 150 and the electrode portions on the vertical electrodes are similar as have been described for memory device 40, in order to achieve confinement of conductive filaments to a specific region. For example, with reference to memory device 70, conductive filaments are confined to a portion of the switching layer 150 that is between a side surface portion of first vertical electrode 404 and a side surface portion of first horizontal electrode 122. In a further example, filament confinement may be achieved in a first portion of the switching layer 150 positioned between a portion of side surface 404b of first vertical electrode 404 that faces and is proximal to a portion of edge 122b of the first horizontal electrode 122. Filament confinement may also be achieved in a second portion of the switching layer 150 positioned between another portion of side surface 404b of first vertical electrode 404 that faces and is proximal to a portion of edge 132b on the second horizontal electrode 132. In another example, the second portion of the switching layer 150 may be positioned between a portion of side surface 404a on the first vertical electrode 404 that faces and is proximal to a portion of edge 134a on a third horizontal electrode 134, and filament confinement may occur therein. In preferred embodiments, the switching layer is in contact with at least one of the electrode portions. For example, a portion of the switching layer is in contact with at least a portion of the side surface of a vertical electrode of memory device 70. In another example, a portion of the switching layer is in contact with at least a portion of the edge on a horizontal electrode of memory device 70.

Figure 11B:
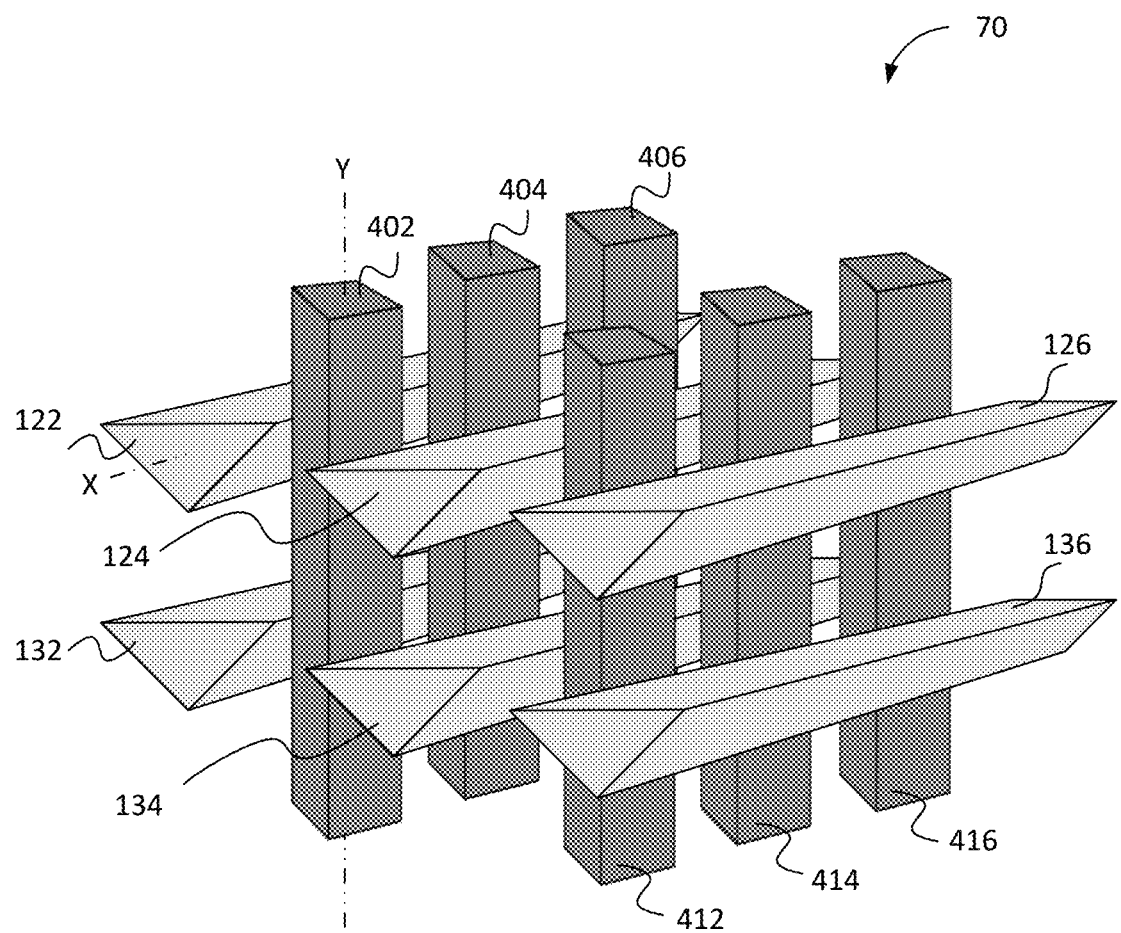

FIG. 11B shows an exemplary simplified perspective view of memory device 70 having a similar configuration to FIG. 2B except that the vertical electrodes 102, 104, 106, 112, 114 and 116 are replaced with vertical electrodes 402, 404, 406, 412, 414 and 416 each having a rectangular cross-section. The switching layer and the interlayer dielectric material are not shown in FIG. 11B so as not to obscure the relative configuration of the electrodes.

Figure 12:
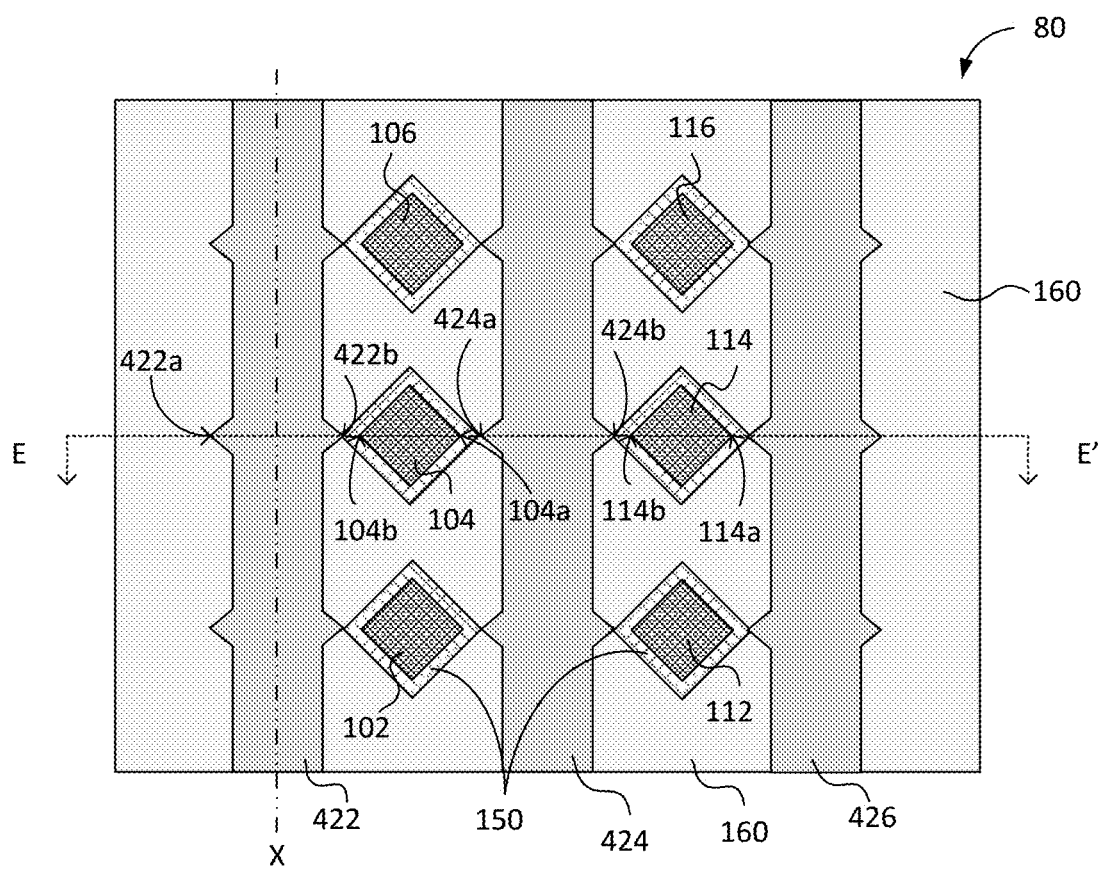
FIG. 12 shows a simplified top-down view of a memory device according to yet another exemplary embodiment of the invention.

With reference to FIG. 12, in which like reference numerals refer to like features in FIG. 1, a memory device 80 is provided in accordance with an alternative embodiment. Memory device 80 may include features similar to memory device 10, including vertical electrodes 102, 104, 106, 112, 114 and 116, switching layers 150 and interlayer dielectric material 160 as already described and need not be repeated here. In other embodiments, the vertical electrodes may be replaced with electrodes having polygonal cross-sections, such as a circular cross-section. For example, the vertical electrodes may be similar to those of memory device 40. Memory device 80 may have a first row of horizontal electrodes 422, 424, 426 and a second row of horizontal electrodes 432, 434 and 436, in place of the horizontal electrodes 122, 124, 126, 132, 134 and 136 of memory device 10. In one aspect of the embodiment, a horizontal electrode may have two sidewall surfaces laterally spaced apart and each of sidewall surface may further include one or more portions that protrude from the sidewall surface. The protruding portions may comprise an edge portion or a surface portion. In a non-limiting example, a first horizontal electrode 422 may have protruding portions which comprise edge portions 422a and 422b and a second horizontal electrode 424 may have protruding portions comprising edge portions 424a and 424b. While it is shown that each pair of protruding edge portions, for example, 422a and 422b, are directly opposite each other, it is understood that the protruding edge portions may also be formed in a staggered configuration based on alternative mask designs. Some or all of the other horizontal electrodes 426, 432, 434, 436 may have similar protruding edge portions like those of horizontal electrodes 422 and 424 as aforementioned.

Figure 13A:
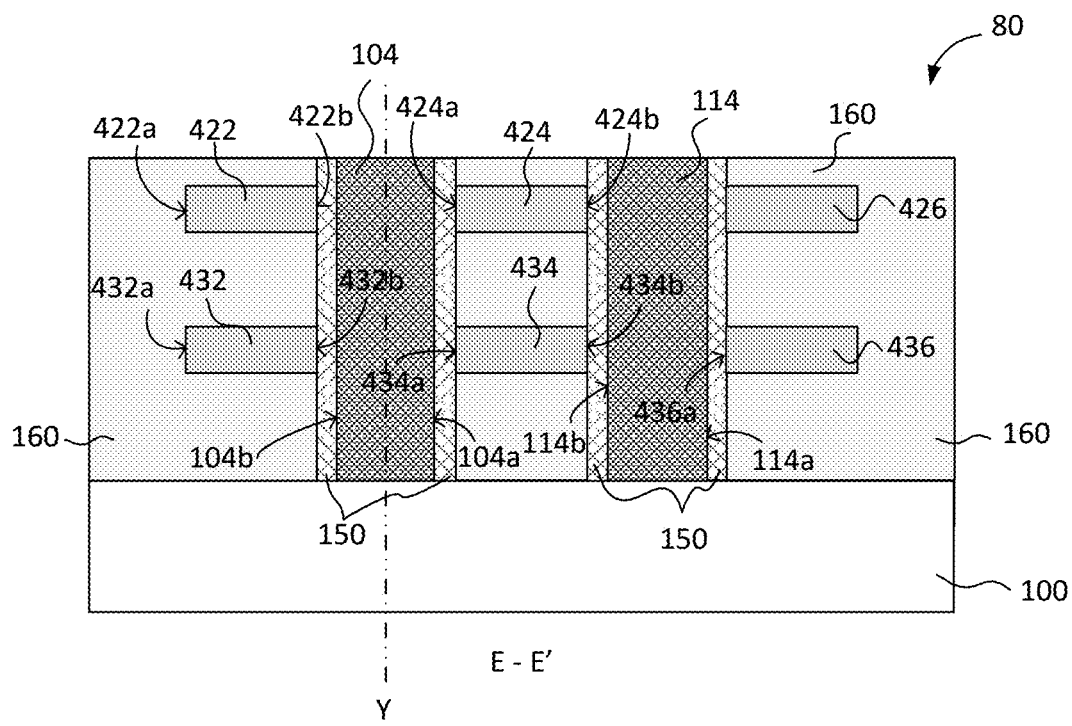
FIG. 13A and FIG. 13B show simplified cross-sectional and perspective views, respectively, of the exemplary embodiment in FIG. 12 according to an aspect of the invention.

Referring now to FIG. 13A in which like reference numerals refer to like features in FIG. 12 and which shows an exemplary cross-section view of memory device 80 taken along dotted line E-E' in FIG. 12. A horizontal electrode may have a polygonal cross-section when viewed along the X-axis. In one aspect of the embodiment, a horizontal electrode may have a cross-section shaped substantially like a rectangle, a square or a trapezium when viewed along the X-axis. The horizontal electrodes in memory device 80 are positioned relative to the switching layers and the vertical electrodes in a similar configuration as that of memory device 10 such that the positions of the electrode portions on the horizontal electrodes relative to the switching layer 150 and the electrode portions on the vertical electrodes are similar as have been described for memory device 10, in order to achieve confinement of conductive filaments to a specific region. For example, with reference to memory device 80, conductive filaments are confined to a portion of the switching layer 150 that is between an edge portion of first vertical electrode 102 and a protruding edge portion of first horizontal electrode 222. In a further example, filament confinement may be achieved in a first portion of the switching layer 150 positioned between a portion of edge 104b of the first vertical electrode 104 that faces and is proximal to a portion of protruding edge 422b of the first horizontal electrode 422. Filament confinement may also be achieved in a second portion of the switching layer 150 positioned between another portion of edge 104b of first vertical electrode 104 that faces and is proximal to a portion of protruding edge 432b on the second horizontal electrode 432. In another example, the second portion of the switching layer 150 may be positioned between a portion of edge 104a on the first vertical electrode 104 that faces and is proximal to a portion of protruding edge 434a on a third horizontal electrode 434, and filament confinement may occur therein. In preferred embodiments, the switching layer is in contact with at least one of the electrode portions. For example, a portion of the switching layer 150 is in contact with at least an edge portion of a vertical electrode of memory device 80. In another example, a portion of the switching layer 150 is in contact with an edge portion of a vertical electrode and an edge portion of protruding portion of the horizontal electrode.

Figure 13B:
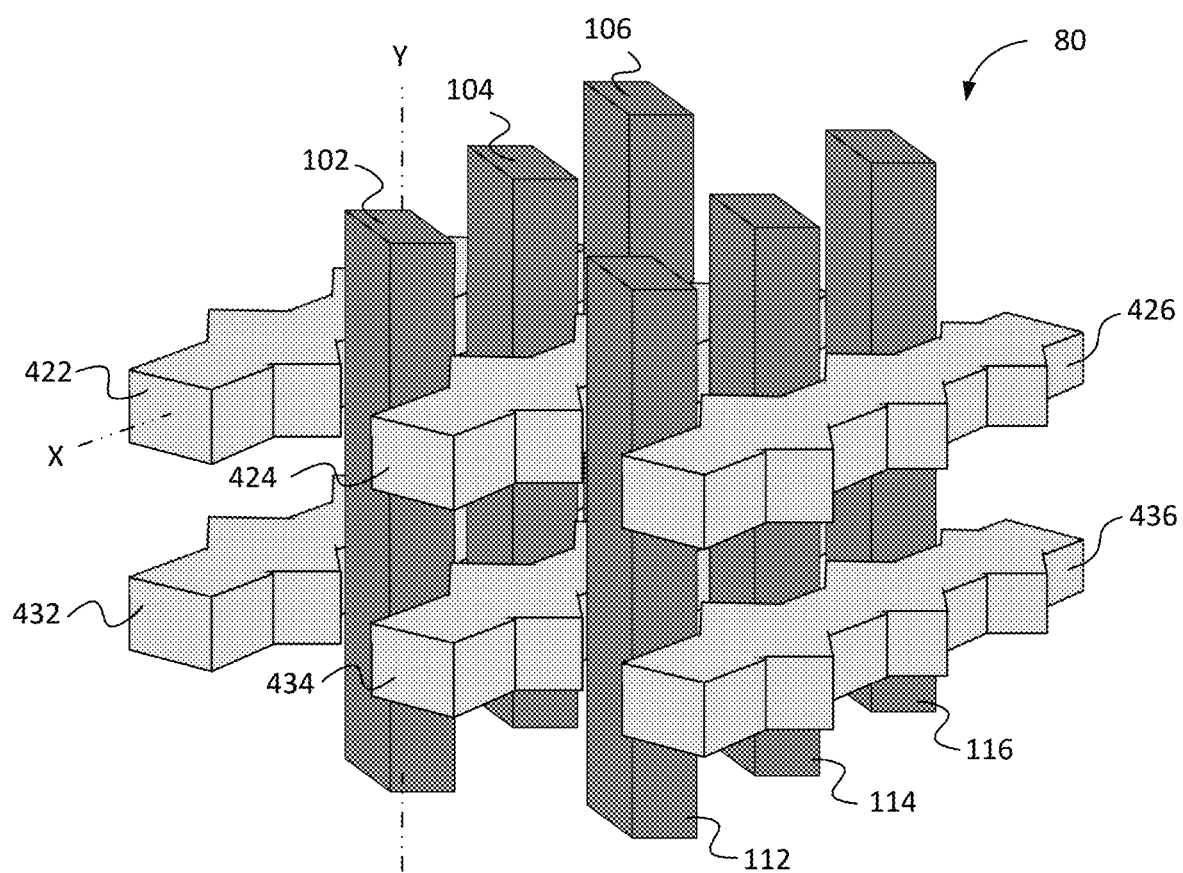

FIG. 13B shows an exemplary simplified perspective view of memory device 80 having a similar configuration to FIG. 2B except that the horizontal electrodes 122, 124, 126, 132, 134 and 136 are replaced with horizontal electrodes 422, 424, 426, 432, 434 and 436. One or more of the horizontal electrode may have two laterally spaced apart sidewall surfaces which may further include one or more portions that protrude from the sidewall surface. The switching layer and the interlayer dielectric material are not shown in FIG. 13B so as not to obscure the relative configuration of the electrodes.

Figure 14:
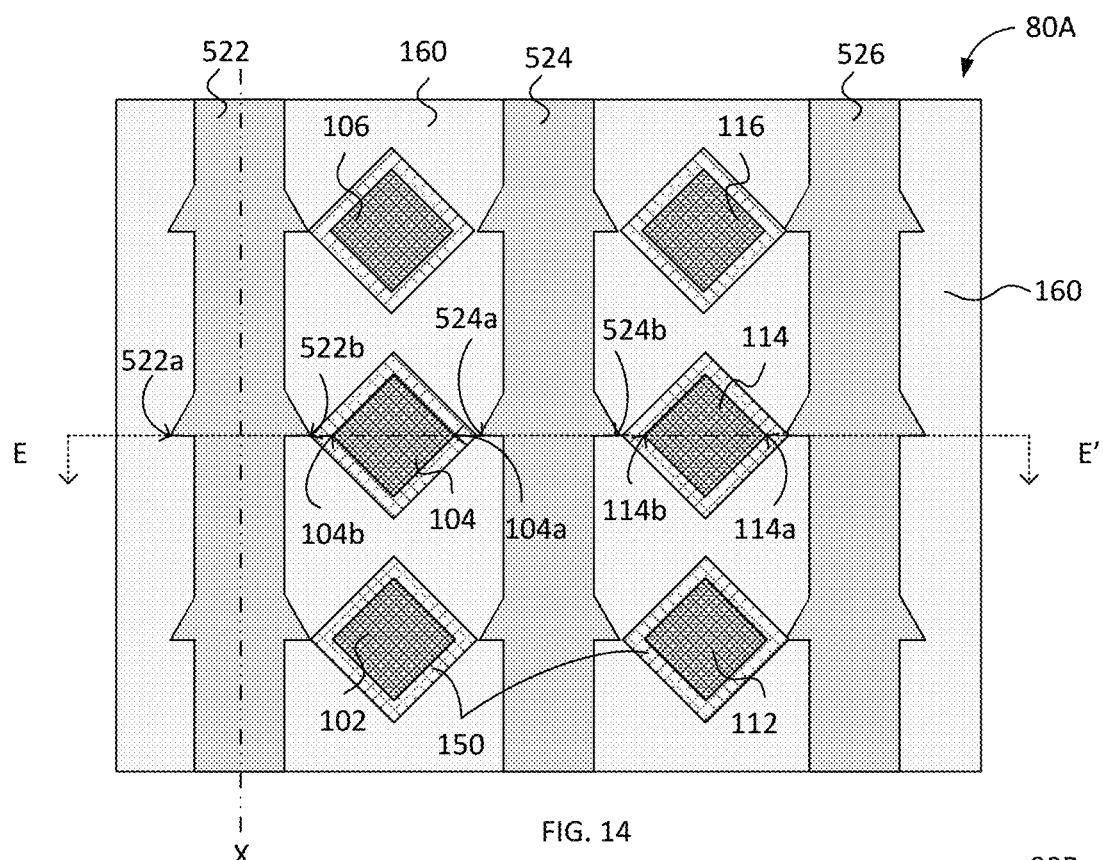
FIG. 14 and FIG. 15 show simplified top-down views of a memory device according to other exemplary embodiments of the invention as alternatives to FIG. 12.

With reference to FIG. 14, in which like reference numerals refer to like features in FIG. 12, a memory device 80A is provided in accordance with an alternative embodiment. Memory device 80A may include features similar to memory device 80, including vertical electrodes 102, 104, 106, 112, 114 and 116, switching layers 150 and interlayer dielectric material 160 as already described and need not be repeated here. Memory device 80A may have a first row of horizontal electrodes 522, 524, 526 and a second row of horizontal electrodes 532, 534 and 536, in place of the horizontal electrodes 422, 424, 426, 432, 434 and 436 of memory device 80. In one aspect of the embodiment, a horizontal electrode may have two sidewall surfaces laterally spaced apart and each of sidewall surface may further include one or more portions that protrude from the sidewall surface. The protruding portions may comprise an asymmetric edge portion, which may be formed when a sidewall surface portion having a larger surface area meets with another sidewall surface portion having a smaller surface area. In a non-limiting example, a first horizontal electrode 522 may have protruding portions which comprise asymmetric protruding edge portions 522a and 522b and a second horizontal electrode 524 may have protruding portions comprising asymmetric protruding edge portions 524a and 524b. In one aspect, each pair of asymmetric protruding edge portions, for example, 522a and 522b, may be directly opposite each other. In another aspect, the asymmetric protruding edge portions may also be formed in a staggered configuration based on alternative mask designs. Some or all of the other horizontal electrodes 526, 532, 534, 536 may have similar asymmetric protruding edge portions like those of horizontal electrodes 522 and 524 as aforementioned. The horizontal electrodes in memory device 80A are positioned relative to the switching layers and the vertical electrodes in a similar configuration as that of memory device 80 such that the relative positions of the electrode portions on the horizontal electrodes with respect to the switching layer 150 and the electrode portions on the vertical electrodes are similar as have been described for memory device 80, in order to achieve confinement of conductive filaments to a specific region. For example, with reference to memory device 80A, conductive filaments are confined to a portion of the switching layer 150 that is between an edge portion of first vertical electrode 102 and an asymmetric protruding edge portion of first horizontal electrode 522. In a further example, filament confinement may be achieved in a first portion of the switching layer 150 positioned between a portion of edge 104b of the first vertical electrode 104 that faces and is proximal to an asymmetric protruding edge portion 522b of the first horizontal electrode 522. Filament confinement may also be achieved in a second portion of the switching layer 150 positioned between another portion of edge 104b of first vertical electrode 104 that faces and is proximal to an asymmetric protruding edge portion 532b on the second horizontal electrode 532. In another example, the second portion of the switching layer 150 may be positioned between a portion of edge 104a on the first vertical electrode 104 that faces and is proximal to an asymmetric protruding edge portion 534a on a third horizontal electrode 534, and filament confinement may occur therein. In preferred embodiments, the switching layer is in contact with at least one of the electrode portions. For example, a portion of the switching layer 150 is in contact with at least an asymmetric protruding edge portion of a horizontal electrode of memory device 80A. In another example, a portion of the switching layer 150 is in contact with an edge portion of a vertical electrode and an asymmetric protruding edge portion of the horizontal electrode.

Figure 15:
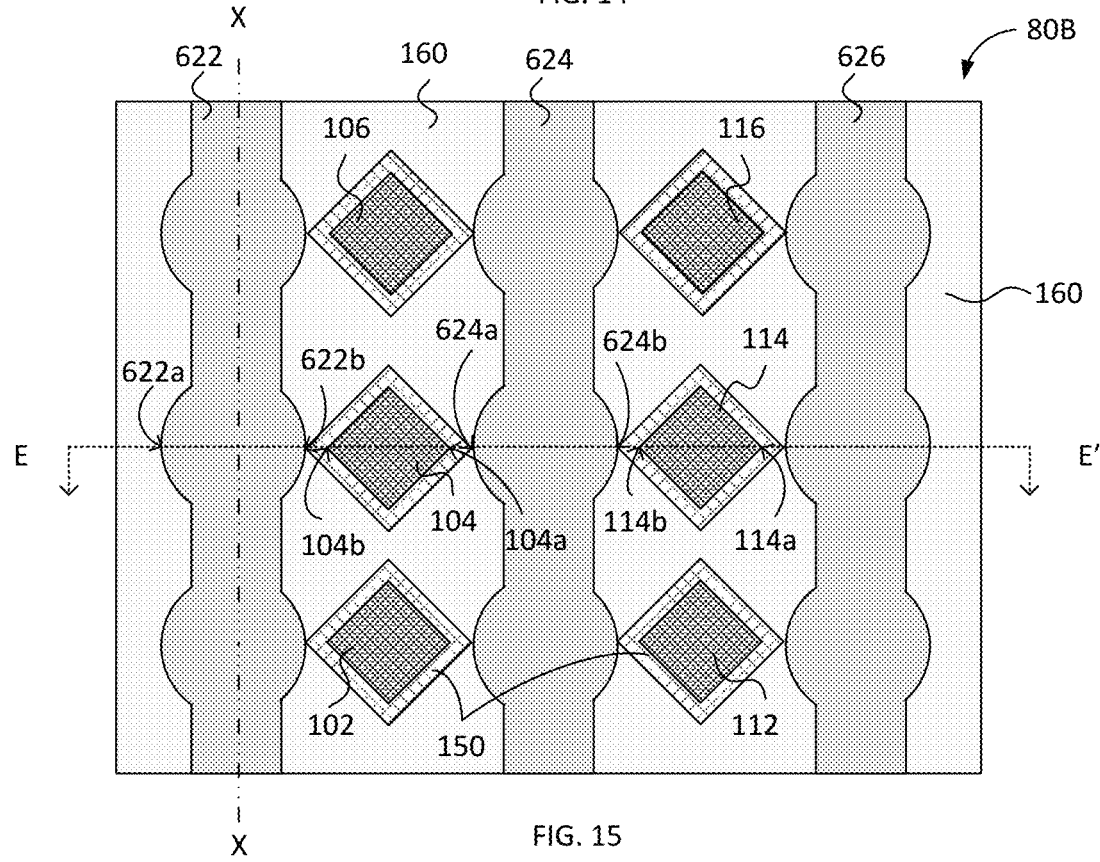

With reference to FIG. 15, in which like reference numerals refer to like features in FIG. 12, a memory device 80B is provided in accordance with an alternative embodiment. Memory device 80B may include features similar to memory device 80, including vertical electrodes 102, 104, 106, 112, 114 and 116, switching layers 150 and interlayer dielectric material 160 as already described and need not be repeated here. Memory device 80B may have a first row of horizontal electrodes 622, 624, 626 and a second row of horizontal electrodes 632, 634 and 636, in place of the horizontal electrodes 422, 424, 426, 432, 434 and 436 of memory device 80. In one aspect of the embodiment, a horizontal electrode may have two sidewall surfaces laterally spaced apart and each of sidewall surface may further include one or more portions that protrude from the sidewall surface. The protruding portions may comprise a surface portion, for example a portion of a curved sidewall surface. In a non-limiting example, a first horizontal electrode 622 may have protruding portions which comprise curved protruding sidewall surface portions 622a and 622b and a second horizontal electrode 624 may have protruding portions comprising curved protruding sidewall surface portions 624a and 624b. In one aspect, each pair of curved protruding sidewall surface portions, for example, 622a and 622b, may be directly opposite each other. In another aspect, the curved protruding sidewall surface portions may also be formed in a staggered configuration based on alternative mask designs. Some or all of the other horizontal electrodes 626, 632, 634, 636 may have similar curved protruding sidewall surface portions like those of horizontal electrodes 622 and 624 as aforementioned. The horizontal electrodes in memory device 80B are positioned relative to the switching layers and the vertical electrodes in a similar configuration as that of memory device 80 such that the relative positions of the electrode portions on the horizontal electrodes with respect to the switching layer 150 and the electrode portions on the vertical electrodes are similar as have been described for memory device 80, in order to achieve confinement of conductive filaments to a specific region. For example, with reference to memory device 80B, conductive filaments are confined to a portion of the switching layer 150 that is between an edge portion of first vertical electrode 102 and a curved protruding sidewall surface portion of first horizontal electrode 622. In a further example, filament confinement may be achieved in a first portion of the switching layer 150 positioned between a portion of edge 104b of the first vertical electrode 104 that faces and is proximal to a curved protruding sidewall surface portion 622b of the first horizontal electrode 622. Filament confinement may also be achieved in a second portion of the switching layer 150 positioned between another portion of edge 104b of first vertical electrode 104 that faces and is proximal to a curved protruding sidewall surface portion 632b on the second horizontal electrode 632. In another example, the second portion of the switching layer 150 may be positioned between a portion of edge 104a on the first vertical electrode 104 that faces and is proximal to a curved protruding sidewall surface portion 634a on a third horizontal electrode 634, and filament confinement may occur therein. In preferred embodiments, the switching layer is in contact with at least one of the electrode portions. For example, a portion of the switching layer 150 is in contact with at least a curved protruding sidewall surface portion of a horizontal electrode of memory device 80B. In another example, a portion of the switching layer 150 is in contact with an edge portion of a vertical electrode and a curved protruding sidewall surface portion of the horizontal electrode.

Figure 16A:
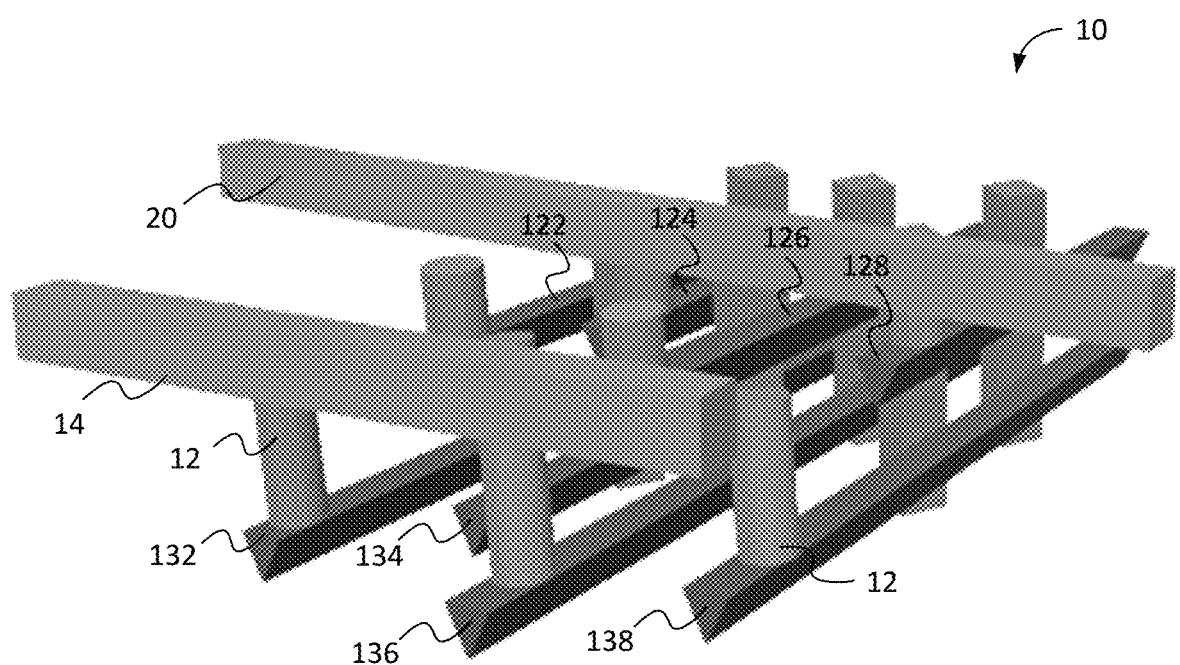
FIG. 16A shows a simplified perspective view of a memory device having exemplary interconnects, according to an aspect of the invention.

With reference to FIG. 16A, in which like reference numerals refer to like features in FIG. 2B and in accordance with another aspect of the embodiment, memory device 10 includes conductive vias 12 which connect the horizontal electrodes to conductive lines 14, 16, 18 and 20 for application of voltage. Conductive lines 16 and 18 are not shown in FIG. 16A so as not to obscure the relative positions of conductive 14 and 20 for illustration purposes. Horizontal electrodes on the same level may be connected to different conductive lines by staggering the lengths of the electrode and varying the heights of conductive vias 12. For example, horizontal electrodes 132 and 134 may each be connected to different conductive lines 14 and 16 by having a different electrode length and a different via height.

Figure 16B:
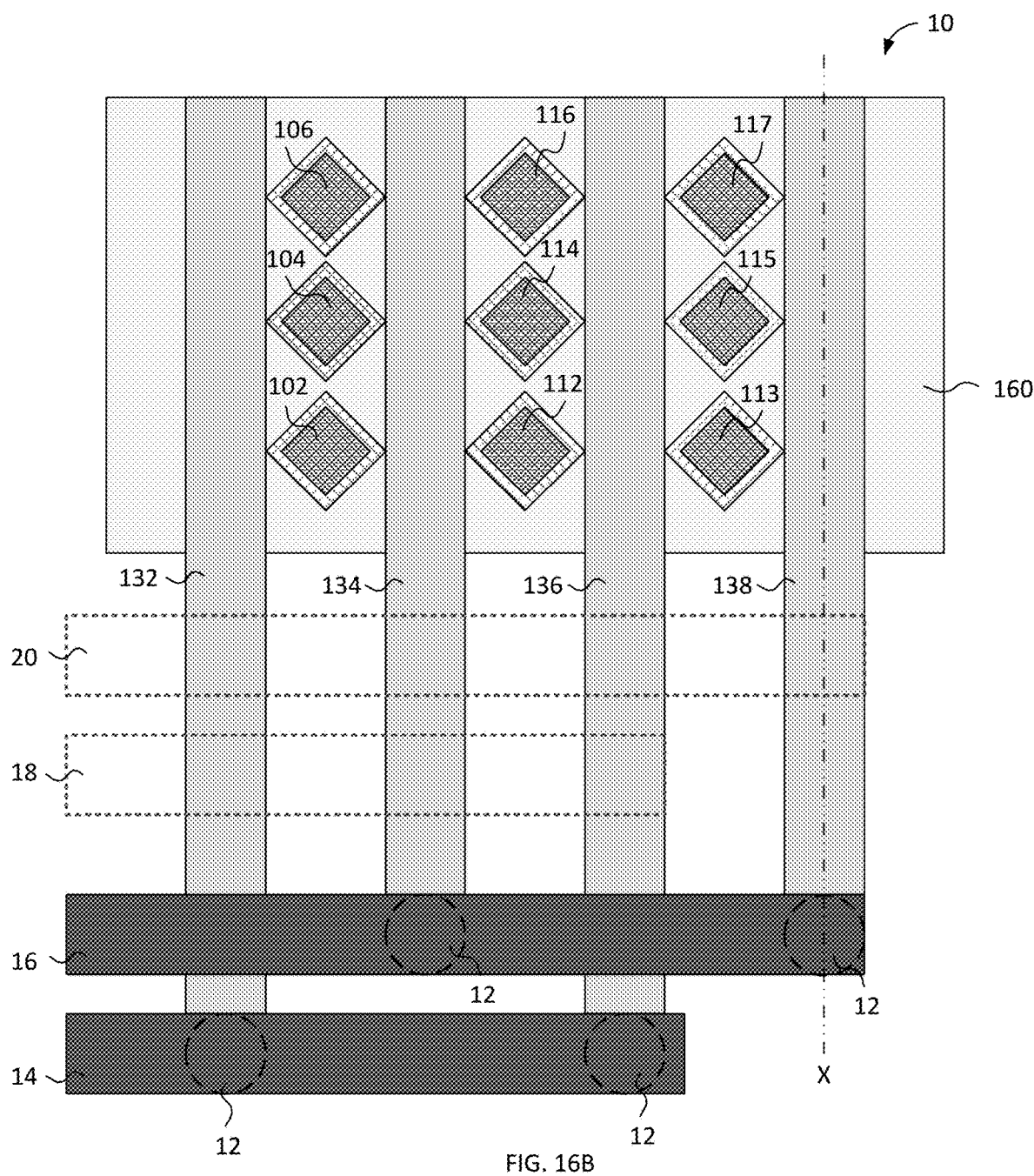
FIG. 16B and FIG. 16C show top-down views of a memory device having exemplary interconnects, according to an aspect of the invention.
Figure 16C:
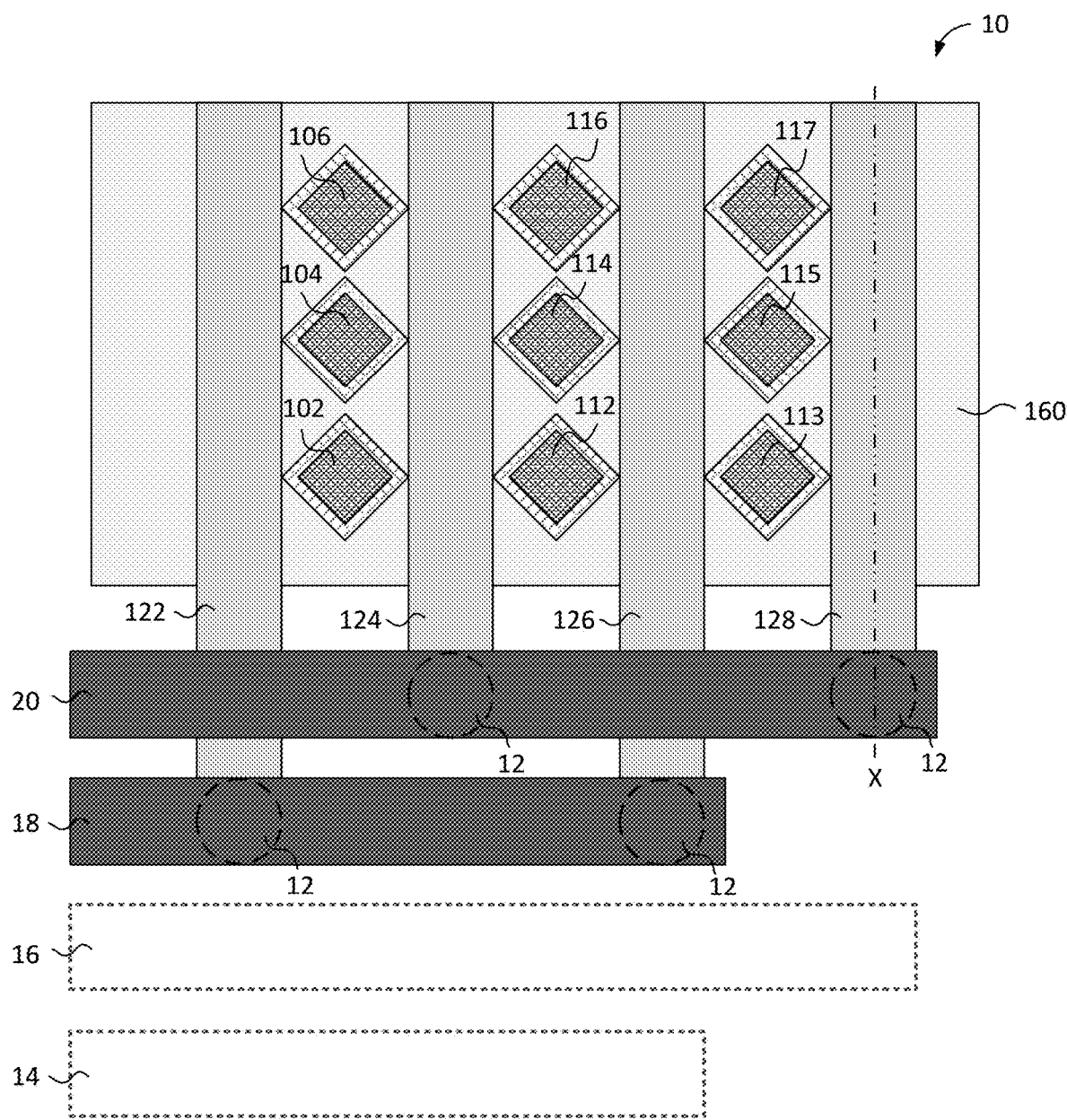

Referring now to FIG. 16B which shows a simplified top view of memory device 10 for a bottom level of horizontal electrodes 132, 134, 136 and 138 having staggered lengths such that horizontal electrodes 132 and 136 are connected to conductive line 14, while horizontal electrode 134 and 138 are connected to conductive line 16. Dotted circular via outlines 12 show the relative positions of conductive vias 12 connecting the conductive lines to the respective horizontal electrodes. Dotted outlines 18 and 20 show the relative positions of conductive lines 18 and 20 respectively, for connecting a different level of horizontal electrodes. FIG. 16C shows a simplified top view of yet another different level of horizontal electrodes, for example, an upper level, wherein horizontal electrodes 122 and 126 are connected to conductive line 18, while horizontal electrodes 124 and 128 are connected to conductive line 20. Similarly, dotted circular via outlines 12 show the relative positions of conductive vias 12 connecting the conductive lines to the respective horizontal electrodes. Dotted outlines show the relative positions of conductive lines 14 and 16 on a different level of horizontal electrodes. As shown, the configuration of staggered horizontal electrode lengths and conductive vias 12 allow for connecting a conductive line to the respective horizontal electrodes without contacting other horizontal electrodes. The heights of the conductive vias 12 may also be varied for each pair of connected horizontal electrodes for efficiency in fabrication and electrical routing purposes.

Figure 17A:
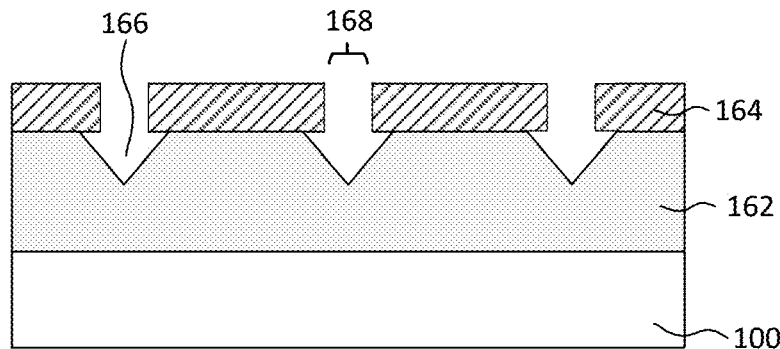
FIGS. 17A-17K show simplified cross-sectional views representing exemplary process steps for fabricating a memory device, according to an embodiment of the invention.
Figure 17B:
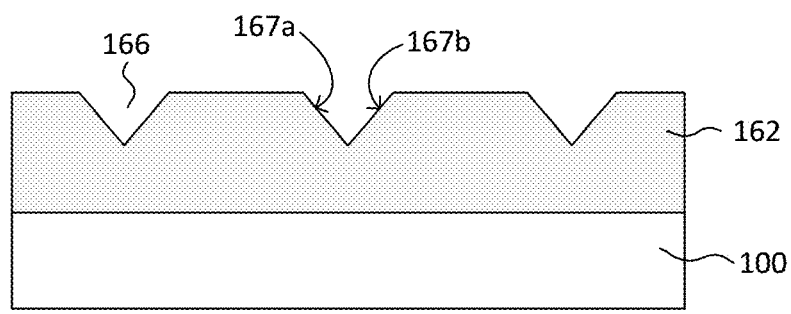
Figure 17C:
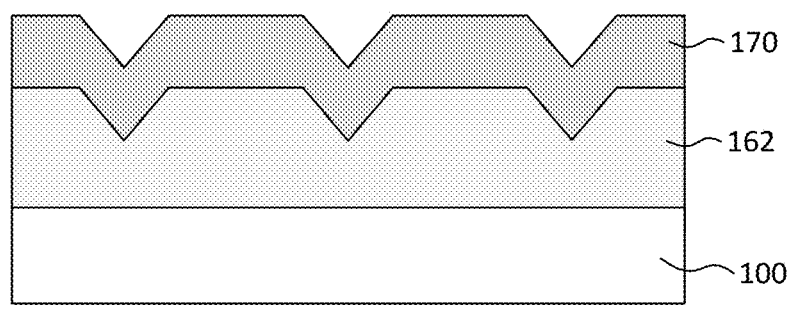

FIGS. 17A through 17K illustrate an exemplary process for making various embodiments of the invention as described above. With reference to FIG. 17A, a first interlayer dielectric layer 162 is provided over a substrate 100 and a first mask layer 164 is deposited over the first interlayer dielectric material 162. First mask layer 164 may comprise a dielectric material, such as silicon dioxide or silicon nitride, and may be patterned by lithography and etching processes to define mask openings 168. The shape and dimensions of mask openings 168 are determined based on the desired shape and dimensions of the resulting horizontal electrodes and the selection of a suitable process for fabricating the openings 166 in the first interlayer dielectric layer 162. For example, a reactive ion etching (RIE) process tuned for aggressive lateral etching may form openings 166 having a top width larger than the dimension of the openings 168. Other material removal processes which results in openings 166 having a substantially sloping sidewalls 167a and 167b may also be utilized in place of the RIE process. This may eventually form horizontal electrodes having a triangular cross-section comprising sidewalls 167a and 167b. In another embodiment as shown in FIG. 18A, a wet etch process in combination with a larger mask opening 168a may result in an opening 166R having substantially a curved surface. This may eventually form horizontal electrodes having a curved surface. FIG. 18B shows yet another embodiment wherein a larger mask opening 168a in combination with a RIE process tuned for minimum lateral etching may form openings 166S having a substantially flat bottom surface and substantially vertical sidewalls. This may eventually form horizontal electrodes having a cross-section shaped like a rectangle, square or trapezium. It is understood that process limitations may result in a non-flat bottom surface and sloped sidewalls, as well as rounded edges.

Referring now to subsequent processing steps in FIGS. 17B and 17C, the first mask layer 164 may subsequently be removed from a top surface of the first interlayer dielectric layer 162 by a suitable etching or stripping process. A first conductive material 170 selected for forming horizontal electrodes is then deposited over the first interlayer dielectric material 162 by physical vapor deposition (PVD), as an example, filling up the openings 166. The excess conductive material 170 may subsequently be removed from the top surface of the first interlayer dielectric material 162 by a suitable material removal process, such as a chemical-mechanical planarization (CMP) process, leaving behind a first row of horizontal electrodes 130 having a top surface substantially level with the top surface of the first interlayer dielectric material 162.

Figure 17D:
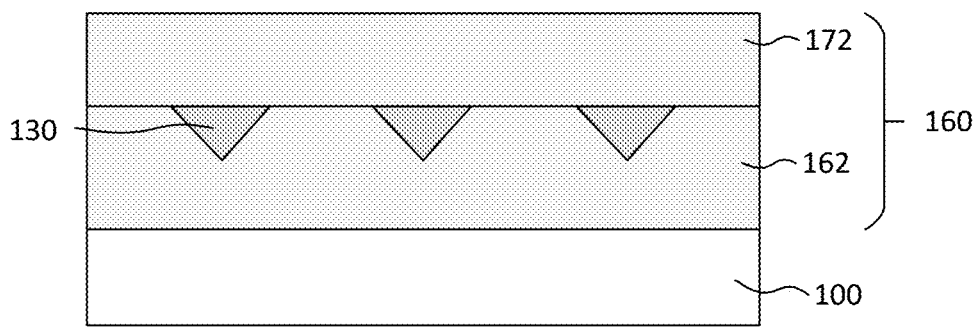
Figure 18A:
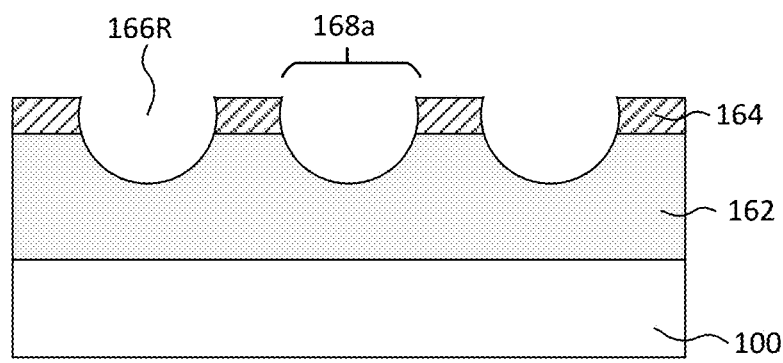
FIG. 18A and FIG. 18B show simplified cross-sectional views representing alternative embodiments for FIG. 17A, according to another embodiment of the invention.
Figure 18B:
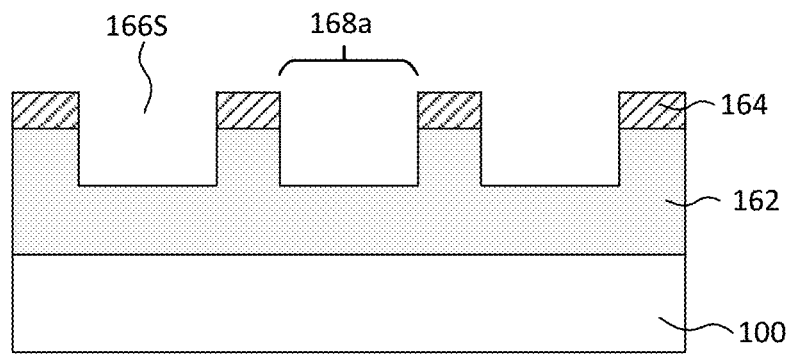

Referring now to FIG. 17D, a second interlayer dielectric material 172 is then deposited over the top surfaces of the horizontal electrodes 130 and the first interlayer dielectric material 162, utilizing suitable deposition techniques, such as chemical vapor deposition (CVD), as an example. The first and second interlayer dielectric materials may be the same or may be different, and are collectively referenced as interlayer dielectric material 160.

Figure 17E:
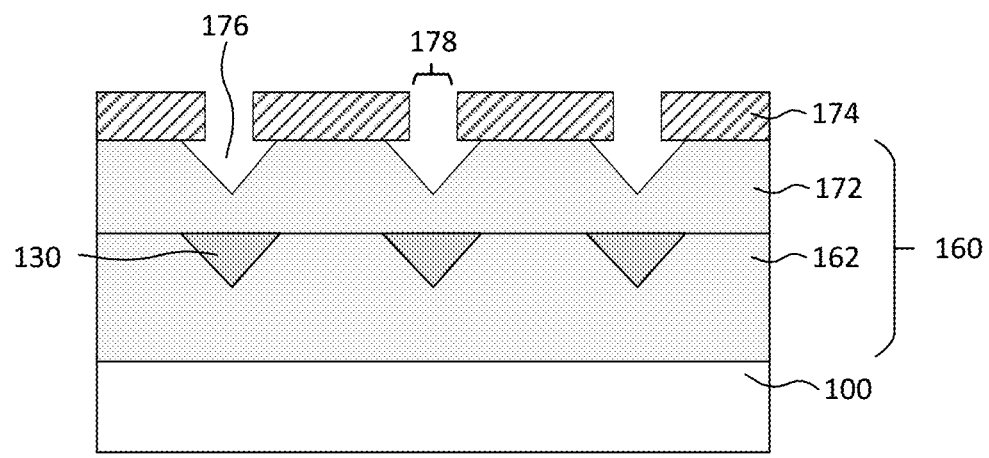

With reference to a subsequent processing step in FIG. 17E, a second mask layer 174 is deposited over the second interlayer dielectric material 172 and may be patterned by suitable lithographic and etching processes as like those for the first mask layer 164 to form mask openings 178. Similar to the descriptions for FIGS. 17A, 18A and 18B, the dimensions of mask openings 178 in combination with an appropriate material removal process will result in the desired cross-section of the resulting horizontal electrodes fabricated in openings 176.

Figure 17F:
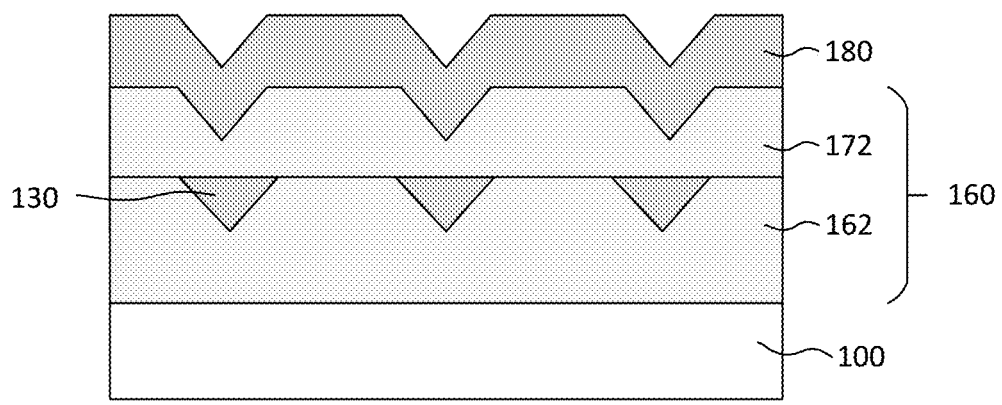
Figure 17G:
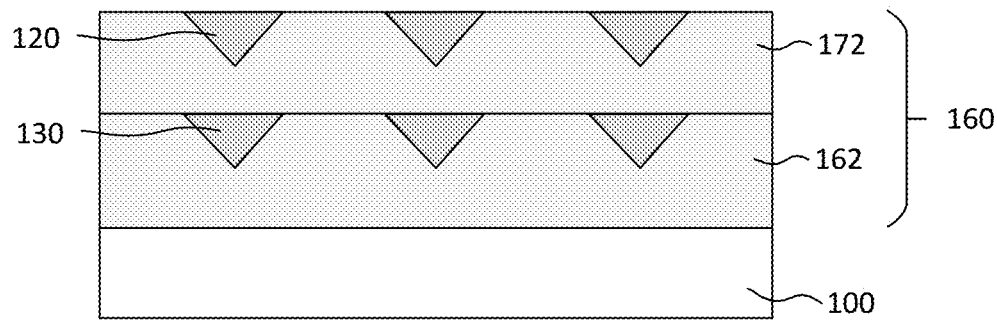

Referring now to FIGS. 17F and 17G, the second mask layer 174 may subsequently be removed from a top surface of the second interlayer dielectric layer 172 by a suitable etching or stripping process. A second conductive material 180 selected for forming horizontal electrodes is then deposited over the first interlayer dielectric material 172 by physical vapor deposition (PVD), as an example, filling up the openings 176. The excess conductive material 180 may subsequently be removed from the top surface of the first interlayer dielectric material 172 by a suitable material removal process, such as a chemical-mechanical planarization (CMP) process, leaving behind a second row of horizontal electrodes 120 having a top surface substantially level with the top surface of the first interlayer dielectric material 172. The second conductive material 180 may be the same as the first conductive material 170, or may be different depending on the design requirements of the memory device. For example, different conductive materials may be useful for creating different memory states for different memory cells.

Figure 17H:
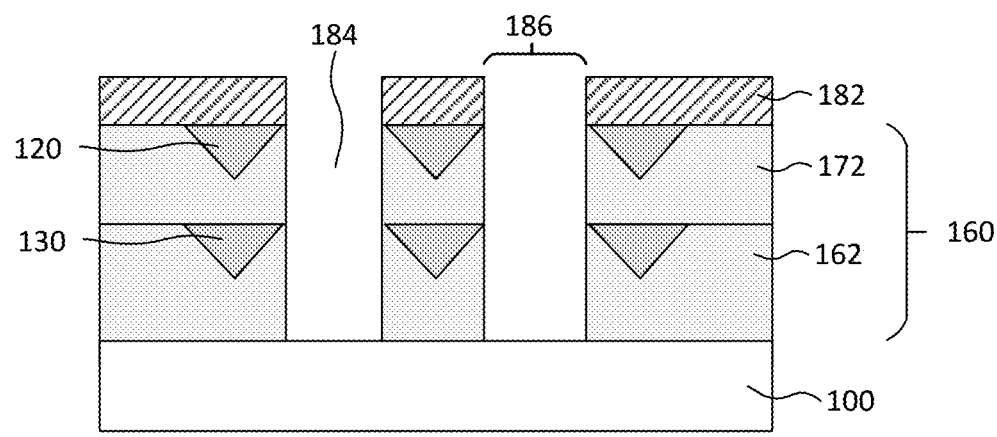
Figure 17I:
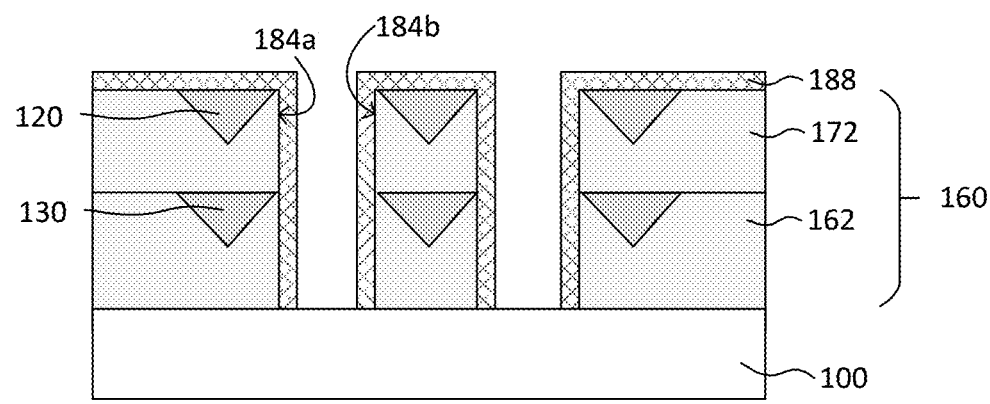

With reference to subsequent processing steps in FIGS. 17H and 17I, a third mask layer 182 is deposited over the surfaces of the horizontal electrodes 120 and the second interlayer dielectric material 172. The third mask layer may be patterned by suitable lithographic and etching processes to form mask openings 186. A suitable material removal process, such as a RIE process may be employed to form openings 184 in the interlayer dielectric material 160, exposing the edges of the horizontal electrodes 120 and 130 along the sidewalls 184a and 184b of the openings 184. FIG. 17I shows a subsequent processing step wherein a switching layer 188 is conformally deposited over the top surfaces of the horizontal electrodes 120 and the second interlayer dielectric material 172, as well as over the sidewalls 184a and 184b. Suitable conformal deposition methods may include but not limited to atomic layer deposition (ALD) and chemical vapor deposition (CVD). Due to the high aspect ratio of the opening 184, there may be minimal or no deposition of the switching layer at the bottom surface of the opening 184. Any switching layer deposited at the bottom surface of the opening 184 may be removed by a selective material removal method, such as anisotropic etching.

Figure 17J:
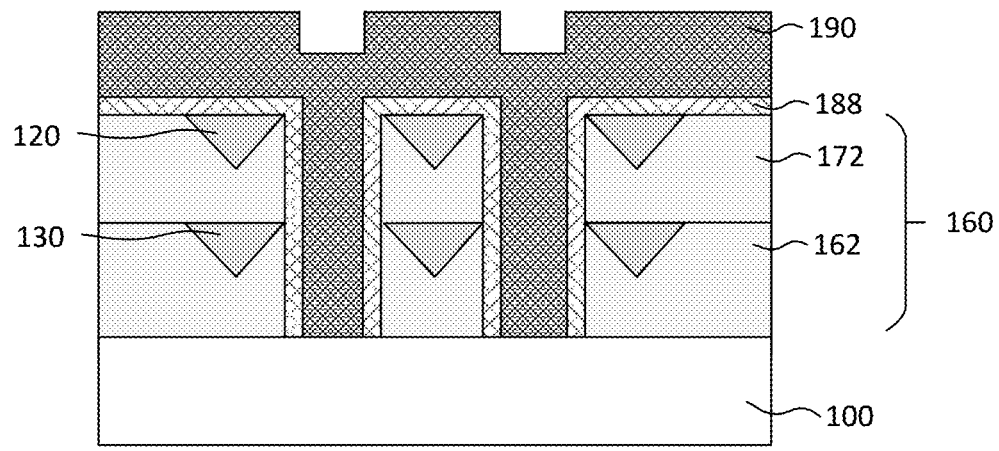
Figure 17K:
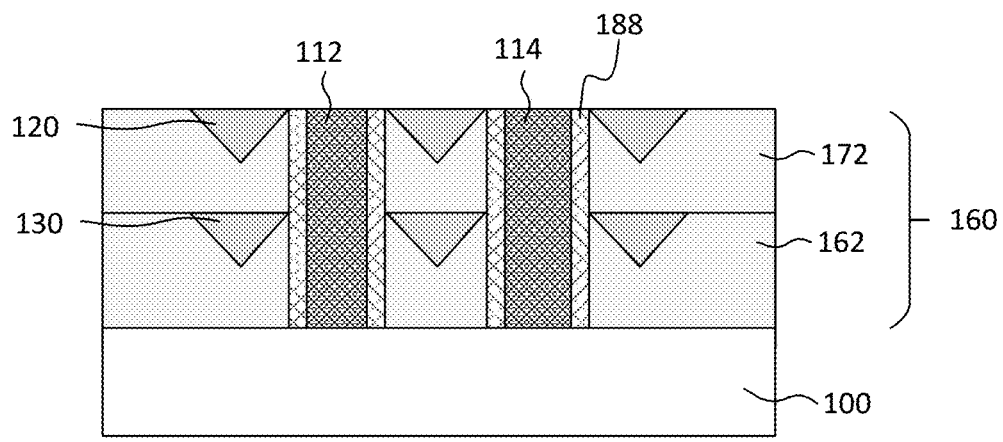

FIG. 17J shows a subsequent processing step wherein a third conductive material 190 selected for forming the vertical electrodes is then deposited over the switching layer 188 by a suitable deposition method, such as physical vapor deposition (PVD) or chemical vapor deposition (CVD) as an example, filling up the openings 184. The excess conductive material 190 may subsequently be removed from the top surface of the first interlayer dielectric material 172 and the horizontal electrodes 120 by a suitable material removal process, such as a chemical-mechanical planarization (CMP) process, leaving behind vertical electrodes 112 and 114 each having a top surface substantially level with the top surfaces of the first interlayer dielectric material 172 and the horizontal electrodes 120.

Figure 19A:
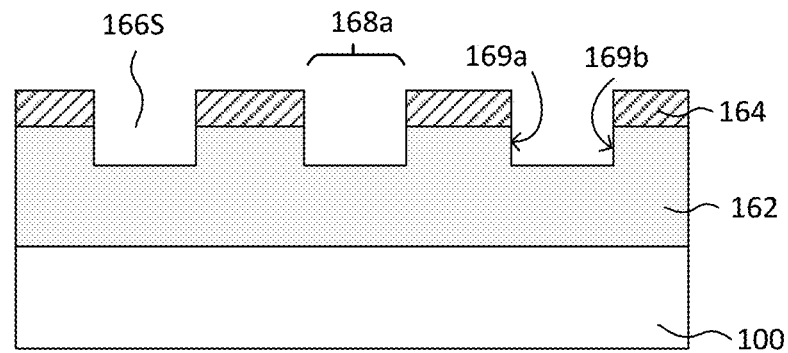
FIGS. 19A-19L show simplified cross-sectional views representing exemplary process steps for fabricating a memory device, according to another embodiment of the invention.

FIGS. 19A through 19L illustrate an exemplary fabrication process for a memory device in accordance with alternative embodiments of the invention. Particularly, the process is suitable for forming memory devices 80, 80A and 80B as illustrated in FIGS. 12, 13A, 13B, 14 and 15. The process has similarities to the process described in FIGS. 17A through 17K, and like reference numerals refer to like features. Referring first to FIG. 19A, a first interlayer dielectric layer 162 is provided over a substrate 100 and a first mask layer 164 is deposited over the first interlayer dielectric material 162. First mask layer 164 is patterned to define mask openings 168a according to suitable lithography and etching processes. The shape and dimensions of mask openings 168a are determined based on the desired shape and dimensions of the resulting horizontal electrodes and the selection of a suitable process for fabricating the openings 166 in the first interlayer dielectric layer 162. For example, mask openings 168a may have a chain-like design in order to form openings 166S having laterally spaced apart sidewalls further including sidewall or edge portions set further into interlayer dielectric material 162 than the sidewalls, so as to form horizontal electrodes with laterally spaced apart sidewall surfaces having protruding portions, such as the horizontal electrodes of FIGS. 12, 14 and 15. The openings 166S may be formed with a reactive ion etching (RIE) process tuned for minimum lateral etching such that the dimensions and design of the openings 166S tracks the dimensions and design of the mask openings 168a. It is understood that process limitations may result in a non-flat bottom surface and slightly sloped sidewalls, as well as rounded edges.

Figure 19B:
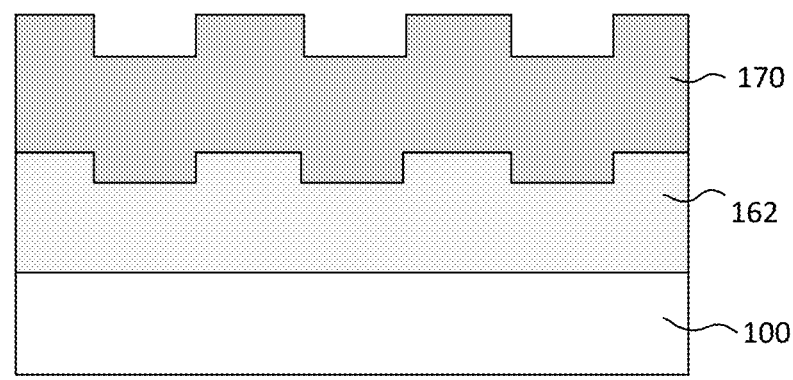
Figure 19C:
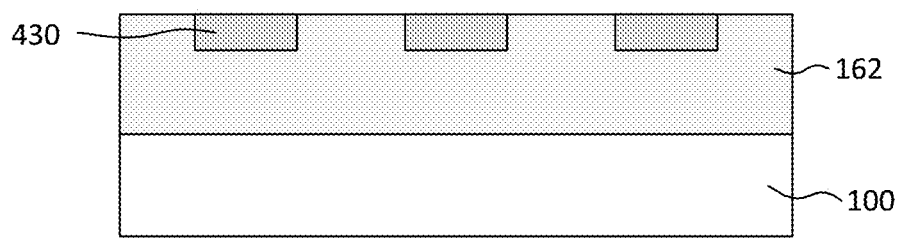
Figure 19D:
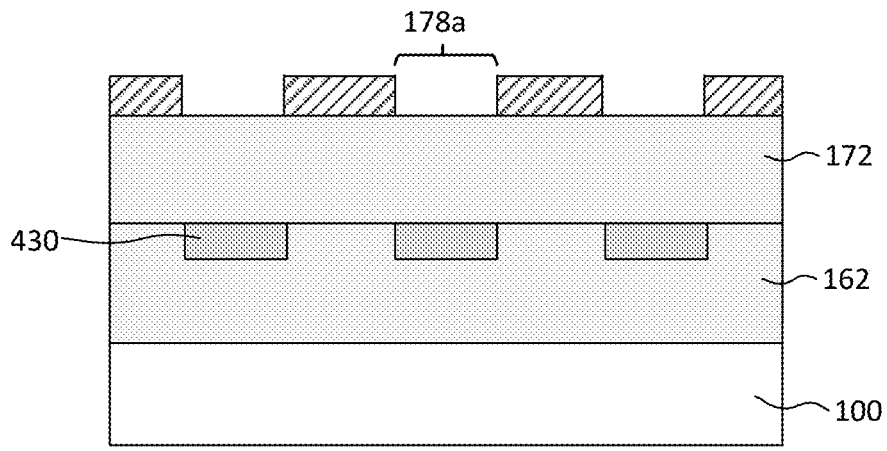

Referring now to subsequent processing steps in FIGS. 19B to 19D, the first mask layer 164 may subsequently be removed from a top surface of the first interlayer dielectric layer 162 by a suitable etching or stripping process. A first conductive material 170 selected for forming horizontal electrodes is then deposited over the first interlayer dielectric material 162 by physical vapor deposition (PVD) for example, filling up the openings 166S. The excess conductive material 170 may be removed from the top surface of the first interlayer dielectric material 162 by a suitable material removal process, such as a chemical-mechanical planarization (CMP) process, leaving behind a first row of horizontal electrodes 430 having a top surface substantially level with the top surface of the first interlayer dielectric material 162. A second interlayer dielectric material 172 is then deposited over the top surfaces of the horizontal electrodes 430 and the first interlayer dielectric material 162, utilizing suitable deposition techniques such as chemical vapor deposition (CVD) process. The first and second interlayer dielectric materials may be the same or may be different. A second mask layer 174 is deposited over the second interlayer dielectric material 172 and patterned by suitable lithographic and etching processes to form mask openings 178a.

Figure 19E:
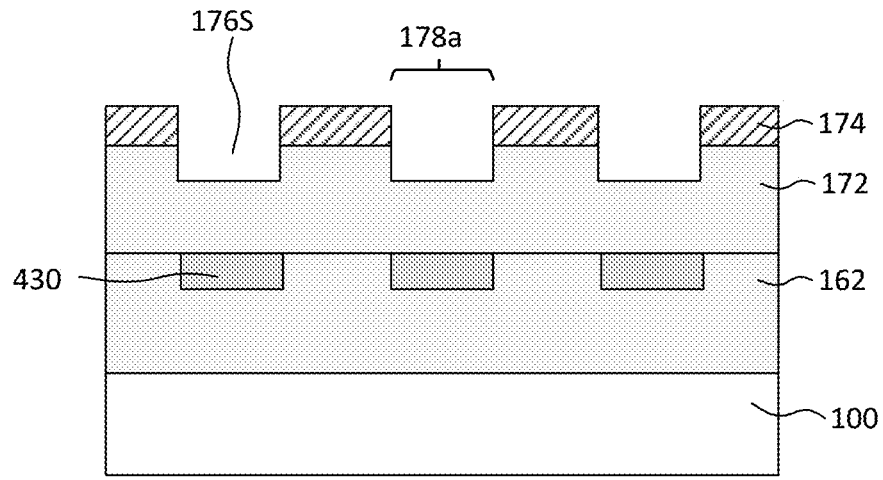
Figure 19F:
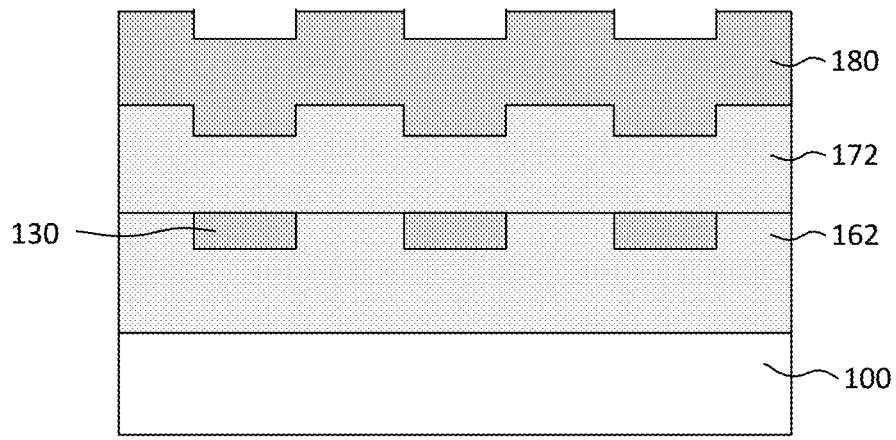
Figure 19G:
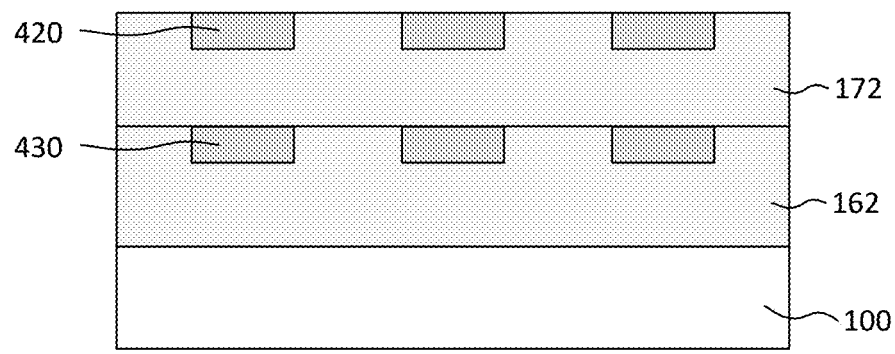

With reference to FIGS. 19E through 19G, a suitable material removal process is used to form openings 176S similar to the earlier openings 166S and the second mask layer 174 may subsequently be removed from a top surface of the second interlayer dielectric layer 172 by a suitable etching or stripping process. A second conductive material 180 selected for forming horizontal electrodes is then deposited over the first interlayer dielectric material 172 by physical vapor deposition (PVD), as an example, filling up the openings 176S. The excess conductive material 180 may subsequently be removed from the top surface of the first interlayer dielectric material 172 by a suitable material removal process, such as a chemical-mechanical planarization (CMP) process, leaving behind a second row of horizontal electrodes 420 having a top surface substantially level with the top surface of the first interlayer dielectric material 172. The second conductive material 180 may be the same as the first conductive material 170, or may be different depending on the design requirements of the memory device. For example, different conductive materials may be useful for creating different memory states for different memory cells.

Figure 19H:
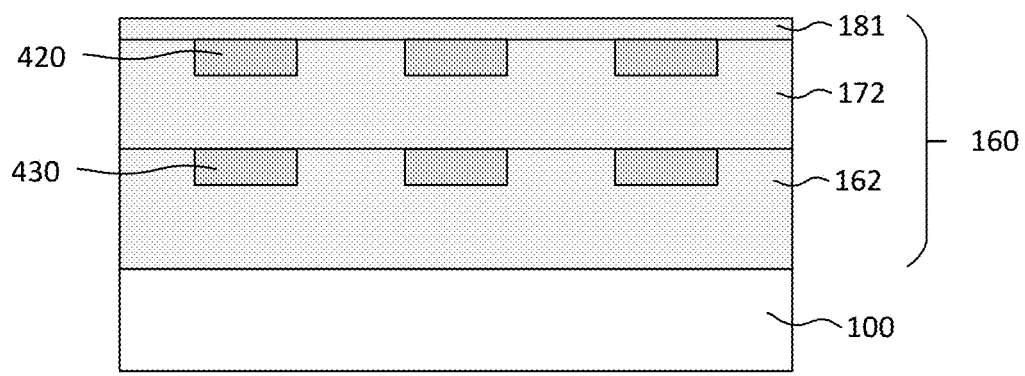
Figure 19I:
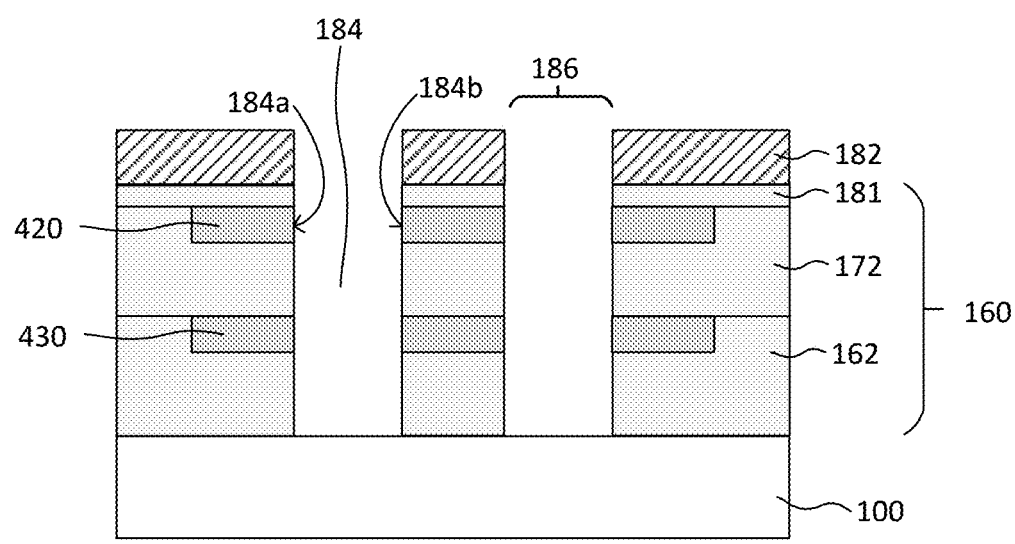
Figure 19J:
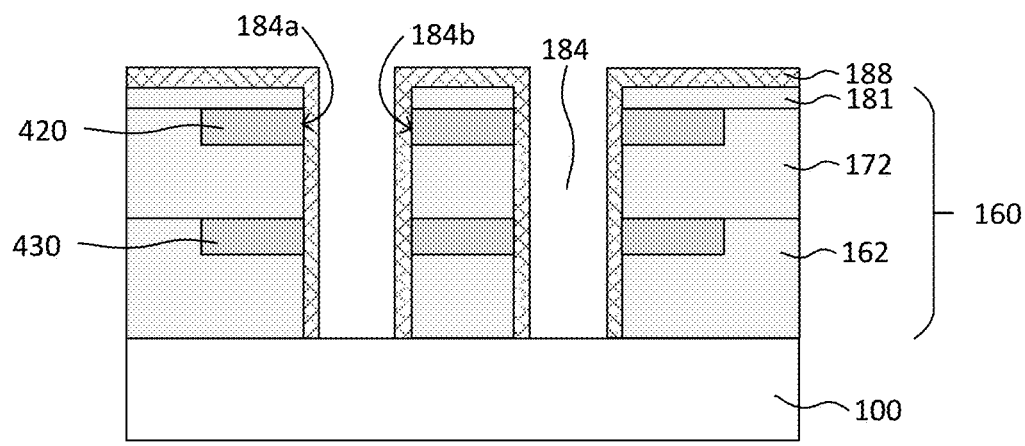

With reference to subsequent processing steps in FIG. 19H to 19J, a third interlayer dielectric material 181 is deposited over the surfaces of the horizontal electrodes 120 and the second interlayer dielectric material 172 by suitable deposition techniques. The first, second and third interlayer dielectric materials may be the same or different, and are collectively referred to as interlayer dielectric material 160. A third mask layer 182 is deposited over the top surface of the interlayer dielectric material 160. Due to the presence of the third interlayer dielectric material 181, the top surfaces of horizontal electrodes 420 are not exposed when the third mask layer is formed. Mask openings 186 are formed in the third mask layer 182 and a suitable material removal process, such as a RIE process may be employed to form openings 184 in the interlayer dielectric material 160, exposing the edges of the horizontal electrodes 420 and 430 along the sidewalls 184a and 184b of the openings 184. FIG. 19J shows a subsequent processing step wherein a switching layer 188 is conformally deposited over the top surface of the third interlayer dielectric material 181, as well as over the sidewalls 184a and 184b. Suitable conformal deposition methods may include but not limited to atomic layer deposition (ALD) and chemical vapor deposition (CVD). Due to the high aspect ratio of the opening 184, there may be minimal or no deposition of the switching layer at the bottom surface of the opening 184. Any switching layer deposited at the bottom surface of the opening 184 may be removed by a selective material removal method, such as anisotropic etching.

Figure 19K:
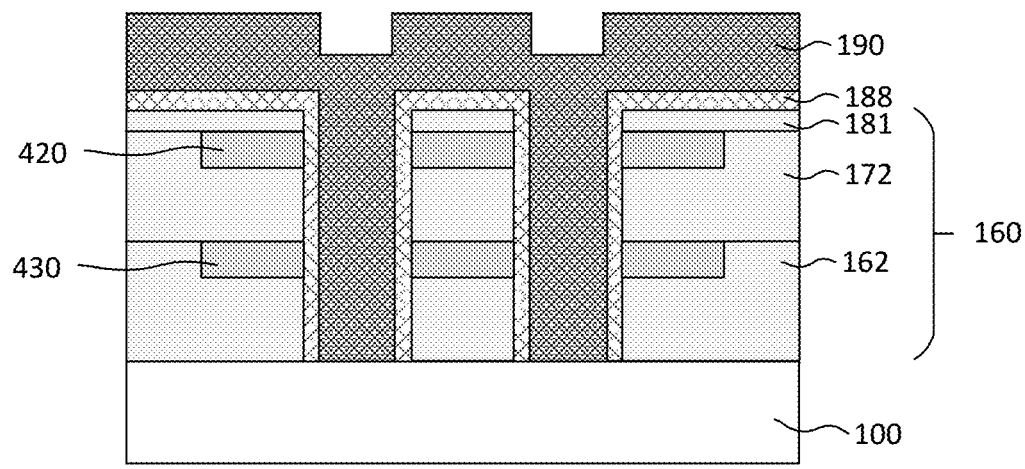
Figure 19L:
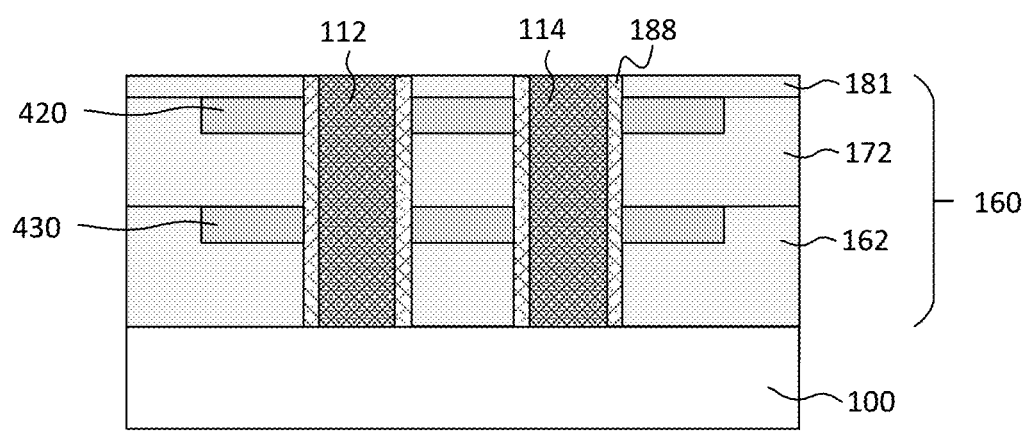

FIG. 19K show subsequent processing steps wherein a third conductive material 190 selected for forming the vertical electrodes is then deposited over the switching layer 188 by a suitable deposition method, such as physical vapor deposition (PVD) or chemical vapor deposition (CVD) as an example, filling up the openings 184. Referring to FIG. 19L, the excess conductive material 190 may subsequently be removed from the top surface of the first interlayer dielectric material 172 and the horizontal electrodes 120 by a suitable material removal process, such as a chemical-mechanical planarization (CMP) process, leaving behind vertical electrodes 112 and 114 each having a top surface substantially level with the top surfaces of the third interlayer dielectric material 181.

Descriptions of embodiments herein are meant to be taken as examples and not meant to be limiting as such. Terms such as "vertical", "horizontal", "top", "bottom", "over", "under", and the like in the description and in the claims, if any, are used for establishing a frame of reference and not necessarily for describing permanent relative positions. The term "horizontal" is defined as a plane parallel to a conventional plane of a semiconductor substrate, rather than its actual three-dimensional orientation in space. The terms "vertical" and "normal" refer to a plane perpendicular to the horizontal. The term "lateral" refers to a direction parallel to the horizontal plane.

Terms such as "connected" or "coupled" indicates that a feature may be directly connected or coupled to or with the other feature, or one or more intervening features may also be present. A feature may be "directly connected" or "directly coupled" to or with another feature if intervening features are absent. A feature may be "indirectly connected" or "indirectly coupled" to or with another feature if at least one intervening feature is present. Terms such as "on" or "contacting" indicates that a feature may be directly on or in direct contact with the other feature, or one or more intervening features may also be present. A feature may be "directly on" or in "direct contact" with another feature if intervening features are absent. A feature may be "indirectly on" or in "indirect contact" with another feature if at least one intervening feature is present.

The terms "first", "second", "third" and the like in the description and in the claims, if any, are used for distinguishing between similar elements and not necessarily for describing a particular sequential or chronological order as required. A method described herein is not necessarily limited in practice to the exact order or number of steps as have been listed, and certain steps may possibly be omitted and/or certain other steps not described herein may possibly be performed in actual practice. Terms such as "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device comprising:
   a first electrode over a substrate, the first electrode having a length along a vertical axis perpendicular to the substrate;
   a second electrode having a length along a horizontal axis, wherein the second electrode has a first side adjacent to the first electrode;
   a third electrode having a length along the vertical axis, wherein the third electrode is positioned adjacent to a second side of the second electrode that is different from the first side; and
   a switching layer adjacent to the first electrode having a portion of the switching layer positioned between a first electrode portion and a second electrode edge.

2. The memory device of claim 1, wherein the switching layer is conformal to a surface of the first electrode.

3. The memory device of claim 1, wherein the second electrode has a single second electrode edge facing the first electrode portion.

4. The memory device of claim 3, wherein the single second electrode edge is arranged on a protruding portion on the second electrode.

5. The memory device of claim 1, wherein the portion of the switching layer is in contact with the first electrode portion.

6. The memory device of claim 1, wherein the first electrode portion comprises a first electrode edge.

7. The memory device of claim 1, wherein the first electrode portion comprises a first electrode surface.

8. The memory device of claim 1, wherein the first electrode comprises a substantially polygonal cross-section when viewed along the vertical axis.

9. The memory device of claim 8, wherein the substantially polygonal cross-section comprises a circle.

10. The memory device of claim 1, wherein the single second electrode edge is substantially parallel to the horizontal axis.

11. The memory device of claim 1, wherein the memory device comprises a resistive random-access memory.

12. The memory device of claim 1, further comprising an interlayer dielectric material over the substrate, wherein the second electrode has a top surface and the top surface is substantially level with a top surface of the interlayer dielectric material.

13. A memory device comprising:
    a substrate;
    a first vertical electrode and a second vertical electrode over the substrate, the first and second vertical electrodes being perpendicular to the substrate;
    a first horizontal electrode parallel to the substrate, wherein the first horizontal electrode has a first side adjacent to the first vertical electrode and a second side adjacent to the second vertical electrode, the second side being opposite to the first side; and
    a first switching layer conformal to the first vertical electrode, the first switching layer is between the first vertical electrode and the first horizontal electrode, and a second switching layer conformal to the second vertical electrode, the second switching layer is positioned between the second vertical electrode and the first horizontal electrode.

14. The memory device of claim 13, wherein the first vertical electrode is laterally displaced from the second vertical electrode.

15. The memory device of claim 13, further comprising a second horizontal electrode parallel to the first electrode, wherein the first horizontal electrode is vertically displaced from the second horizontal electrode.

16. The memory device of claim 15, further comprising a third horizontal electrode parallel to and laterally displaced from the first and second horizontal electrodes, wherein the second vertical electrode is between the second and third horizontal electrodes, and the first and third horizontal electrodes are connected to the same electrical input.

17. The memory device of claim 13, wherein the first and second horizontal electrodes are connected to different electrical inputs.

18. The memory device of claim 13, wherein the first horizontal electrode has a substantially flat top surface including a single electrode edge facing the first vertical electrode.

19. A method of fabricating a memory device comprising:
    providing a first electrode over a substrate, the first electrode having a length along a vertical axis perpendicular to the substrate;
    providing a second electrode having a length along a horizontal axis, wherein the second electrode has a first side adjacent to the first electrode;
    providing a third electrode having a length along the vertical axis, wherein the third electrode is positioned adjacent to a second side of the second electrode that is different from the first side; and providing a switching layer adjacent to the first electrode, having a portion of the switching layer positioned between a first electrode portion and a second electrode edge.

* * * * *